US007030416B2

(12) United States Patent
Kitagawa et al.

(10) Patent No.: US 7,030,416 B2
(45) Date of Patent: Apr. 18, 2006

(54) MICRO ELECTRO MECHANICAL SYSTEM APPARATUS

(75) Inventors: Mitsuhiko Kitagawa, Tokyo (JP); Yoshiaki Aizawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/618,258

(22) Filed: Jul. 11, 2003

(65) Prior Publication Data

US 2004/0061106 A1 Apr. 1, 2004

(30) Foreign Application Priority Data

Jul. 15, 2002 (JP) ............................ 2002-206049
Jun. 19, 2003 (JP) ............................ 2003-175120

(51) Int. Cl.
*H01L 27/15* (2006.01)
*H01L 31/12* (2006.01)
*H01L 33/00* (2006.01)

(52) U.S. Cl. ........................................ 257/79; 257/414

(58) Field of Classification Search .................. 257/79, 257/414
See application file for complete search history.

(56) References Cited

U.S. PATENT DOCUMENTS 5,578,976 A 11/1996 Yao

*Primary Examiner*—Long Pham
*Assistant Examiner*—Shrinivas H. Rao
(74) *Attorney, Agent, or Firm*—Hogan & Hartson, L.L.P.

(57) ABSTRACT

A MEMS (micro electro mechanical system) apparatus is equipped with a light-emitting circuit, having a light-emitting device, to emit light; a light-receiving circuit having a series circuit of series-connected light-receiving devices that receive the emitted light to generate a voltage; and a MEMS assembly driven by the generated voltage.

9 Claims, 19 Drawing Sheets

MICRO ELECTRO MECHANICAL SYSTEM APPARATUS

CROSS REFERENCE TO RELATED APPLICATIONS

This application is based upon and claims benefit of priority from the prior Japanese Patent Applications No. 2002-206049 filed on Jul. 15, 2002 and No. 2003-175120 filed on Jun. 19, 2003 in Japan, the entire contents of which are incorporated by reference.

BACKGROUND OF THE INVENTION

1. Field of Art

The present invention relates to a micro electro mechanical system (MEMS) apparatus.

2. Related Art

Micro electro mechanical systems have been used in several fields. For example, MEMS-based radio frequency (RF) switches (RF-MEMS switches) offer low transmission loss and high isolation in an off-state.

FIG. 12 shows a schematic illustration of a switch with electrostatic action to turn on or off.

An RF-MEMS switch 11, shown in FIG. 12, consists of two electrodes 11*a* and 11*b*, and a movable contact 11*c* and fixed contacts 11*d* and 11*e* provided between the electrodes 11*a* and 11*b*. The contacts 11*d* and 11*e* are connected to input and output terminals 13 and 14, respectively.

A high potential is applied to either of the electrodes 11*a* and 11*b* whereas a low potential to the other.

A more detailed configuration of the RF-MEMS switch 11 is shown in FIGS. 13A to 13E. FIG. 13A is a plan view of the switch 11. FIG. 13B is a cross section of the switch 11 taken on line A–A' in FIG. 13A in an open-state. FIG. 13C is a cross section of the switch 11 taken on line B–B' in FIG. 13A in an open-state. FIG. 13D is a cross section of the switch 11 taken on line A–A' in FIG. 13A in a closed-state. FIG. 13E is a cross section of the switch 11 taken on line B–B' in FIG. 13A in a closed-state.

As shown in FIGS. 13A to 13E, the electrode 11*b* is fixed on a substrate 30 whereas the electrode 11*a* is fixed on a cantilever 20 having an anchor 20*a* fixed on the substrate 30.

The movable contact 11*c* is provided at an end of the cantilever 20, opposite to the other end at which the anchor 20*a* is provided. The fixed contacts 11*d* and 11*e* are provided on the substrate 30.

No voltages to the electrodes 11*a* and 11*b* keep the cantilever 20 in an up-state position, as shown in FIGS. 13B and 13C, so that the movable contact 11*c* does not touch the fixed contacts 11*d* and 11*e*, thus RF-MEMS switch 11 is in an open-state.

Contrary to this, a certain voltage across the electrodes 11*a* and 11*b* generates an electrostatic force to shift the cantilever 20 in a down-state position, as shown in FIGS. 13D and 13E, so that the movable contact 11*c* touch the fixed contacts 11*d* and 11*e*, thus RF-MEMS switch 11 is brought in a closed-state.

One possible application of capacitive RF-MEMS switches such as explained above is a mobile communications device thanks to low transmission loss and high isolation in an off (open)-state.

Capacitive RF-MEMS switches, however, require a drive voltage in the range from several ten to several hundred volts to give a large spring constant to a movable constant for avoiding contact between the movable constant and fixed contacts to achieve high reliability.

Accordingly, installation of such a capacitive RF-MEMS switch in a mobile communications device powered by a several-volt battery requires a boosted battery voltage or a lower drive voltage to the switch.

A lower drive voltage, however, causes lower reliability of capacitive RF-MEMS switches.

Integration of a power IC with a capacitive RF-MEMS switch, for giving a high drive voltage to the switch, could generate noises that affect the switch.

SUMMARY OF THE INVENTION

A MEMS (micro electro mechanical system) apparatus according to the first aspect of the present invention includes: a light-emitting circuit, having a light-emitting device, to emit light; a light-receiving circuit having a series circuit of series-connected light-receiving devices that receive the emitted light to generate a voltage; and a MEMS assembly driven by the generated voltage.

A MEMS (micro electro mechanical system) apparatus according to the second aspect of the present invention includes: a first light-emitting circuit, having a first light-emitting device, to emit light; a second light-emitting circuit, having a second light-emitting device, to emit light; a first light-receiving circuit having a series circuit of series-connected light-receiving devices that receive the light emitted from the first light-emitting circuit, to generate a voltage; a second light-receiving circuit having a series circuit of series-connected light-receiving devices that receive the light emitted from the second light-emitting circuit, to generate a voltage; a discharging circuit to discharge a voltage generated across the series circuit of the second light-receiving circuit when emission of light from the second light-emitting circuit is brought in a halt; a MEMS assembly including an RF-MEMS switch having a first electrode connected to a high-potential terminal of the first light-receiving circuit and a second electrode; a resistive element provided between the first and second electrodes; and a MOS switch, a drain of the MOS switch being connected to the second electrode, a source of the MOS switch being connected to a low-potential terminal of the first light-receiving circuit, and a gate of the MOS switch being connected to a high-potential terminal of the second light-receiving circuit via the discharging circuit.

A MEMS (micro electro mechanical system) apparatus according to the third aspect of the present invention includes: a light-emitting circuit, having a light-emitting device, to emit light; a first light-receiving circuit having a first series circuit of series-connected light-receiving devices that receive the light emitted from the light-emitting circuit, to generate a voltage; a second light-receiving circuit having a second series circuit of series-connected light-receiving devices that receive the light emitted from the light-emitting circuit, to generate a voltage, a high-potential terminal of the second series circuit being connected to a low-potential terminal of the first light-receiving circuit; a resistive element connected in parallel to the first light-receiving circuit; a junction field-effect transistor, a drain of the transistor being connected to the high-potential terminal of the second series circuit, a source of the transistor being connected to a low-potential terminal of the second series circuit, a gate of the transistor being connected to a high-potential terminal of the first series circuit; and a MEMS assembly driven by the voltage generated by the second light-receiving circuit.

DETAILED DESCRIPTION OF EMBODIMENT

Several embodiments according to the present invention will be disclosed with reference to the attached drawings.

[First Embodiment]

Figure 1:
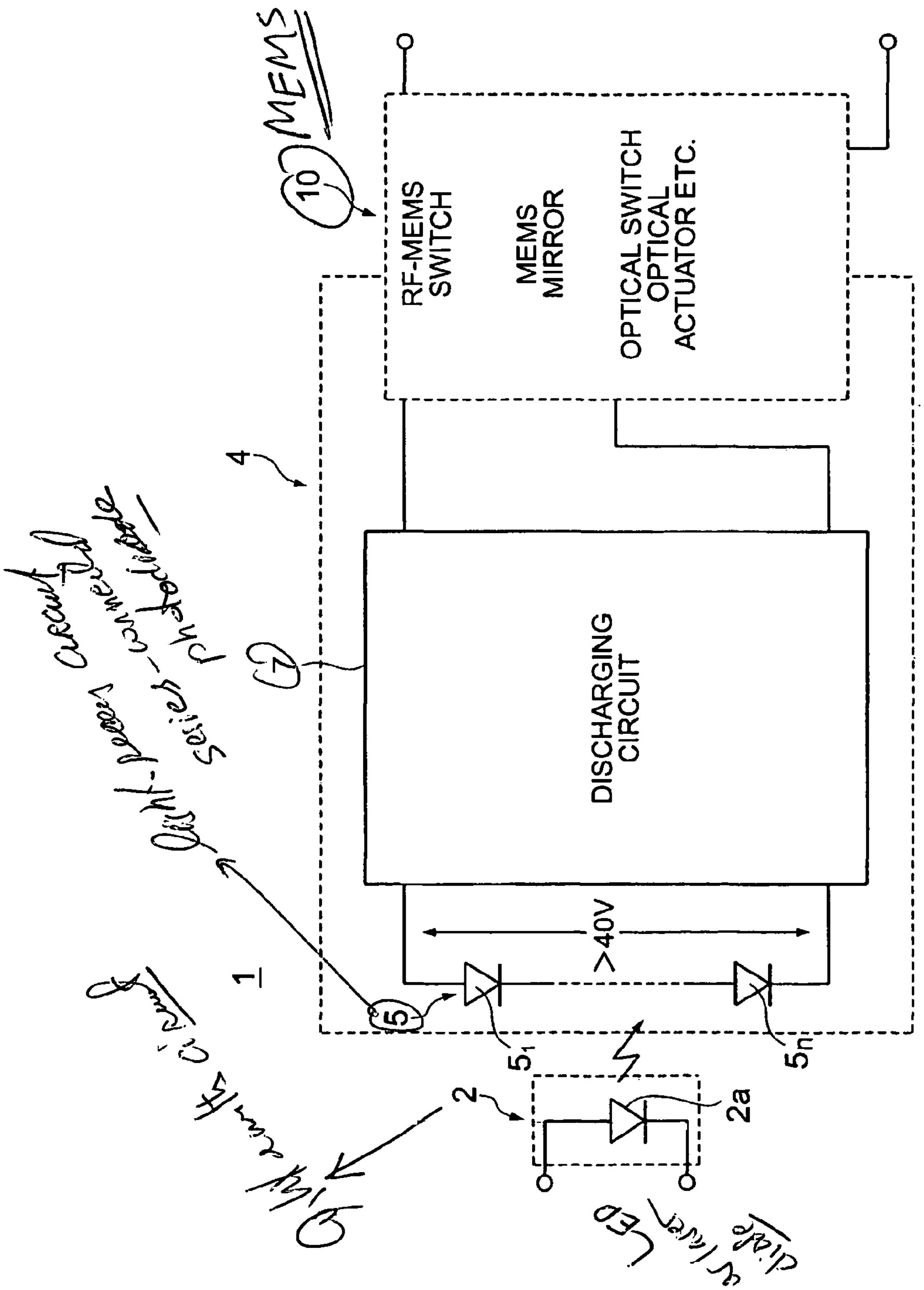
FIG. 1 shows a block diagram of a MEMS apparatus according to a first embodiment of the present invention.

Shown in FIG. 1 is a MEMS apparatus of a first embodiment according to the present invention.

A MEMS 1 is equipped with a light-emitting circuit 2 having a light-emitting device 2*a*, such as, an LED (Light-Emitting Diode), an LD (laser Diode), or an organic light-emitting device; a light-receiving circuit 5 having series-connected photo diodes $5_1, \ldots,$ and $5_n$; a discharging circuit 7; and a MEMS (Micro Electro Mechanical System) 10.

The MEMS 10 in this embodiment may be of an RF-MEMS switch, a MEMS mirror, a MEMS optical switch or a MEMS actuator.

The light-receiving circuit 5 and the discharging circuit 7 constitute a drive circuit 4 for driving the MEMS 10. The circuits 5 and 7 are integrated on a chip. The drive circuit 4 and the MEMS 10 may be integrated on a chip.

The light-emitting circuit 2 emits light in response to an input voltage of several volts. A voltage is generated across the anode and cathode of each photo diode $5_i$ (i=1, . . . , n) when the light-receiving circuit 5 receives the emitted light. More numbers of the photo diodes $5_i$ generate a higher voltage across the light-receiving circuit 5, ten times or more the input voltage to the light-emitting device 2*a*, such as, 10 to 40 volts or more being generated across the circuit 5.

A high voltage generated across the light-receiving circuit 5 is applied to control electrodes of the MEMS 10 via the discharging circuit 7, thus the MEMS 10 being activated. The MEMS 10 is brought in a halt when the light-emitting circuit 2 is turned off to not emit light so that the control electrodes are short-circuited by the discharging circuit 7.

As disclosed, a high voltage for driving the MEMS 10 is generated at the light-receiving circuit 5 having a series-connected photo diodes $5_i$ (i=1, . . . , n), such as, solar batteries.

The component acting as a driver in the drive circuit 4 is the light-emitting circuit 2 optically coupled but electrically isolated from the light-receiving circuit 5.

The light-emitting circuit 2 does not require a series-connected configuration, activated with a voltage of one to several volts.

This simple configuration with several volts of an input voltage generates several ten to several hundred volts of an AC or a DC driving voltage to the MEMS 10 at high performance and reliability.

The driving voltage for the MEMS 10 is preferably 60 volts or higher, 100 volts or higher, or 600 volts or higher. Such a high driving voltage can be generated by the light-receiving circuit 5 for higher performance.

Electrical isolation between the light-emitting circuit 2 (driver) and the light-receiving circuit 5 for generating a drive voltage achieves less noises to the MEMS 10, compared to known power-IC modules and, especially, to integrated MEMS/power-IC circuitry.

The MEMS 10 may be of a capacitive type which is electrically isolated from a booster (the light-emitting circuit 2 and the electrically isolated light-receiving circuit 5) via a capacitive driver of the MEMS 10, achieving enhanced noise protection.

The light-receiving circuit 5 having series-connected photo diodes exhibits high voltage withstanding and generates high-quality boosted voltage waveforms with less number of components, compared to known power ICs.

The MEMS 10 may be a sensor in this embodiment, which offers a wide dynamic range thanks to the photo diodes of the light-receiving circuit 5.

The MEMS 10 may be of a capacitive type or a magnetic type, etc.

[Second Embodiment]

Figure 2:
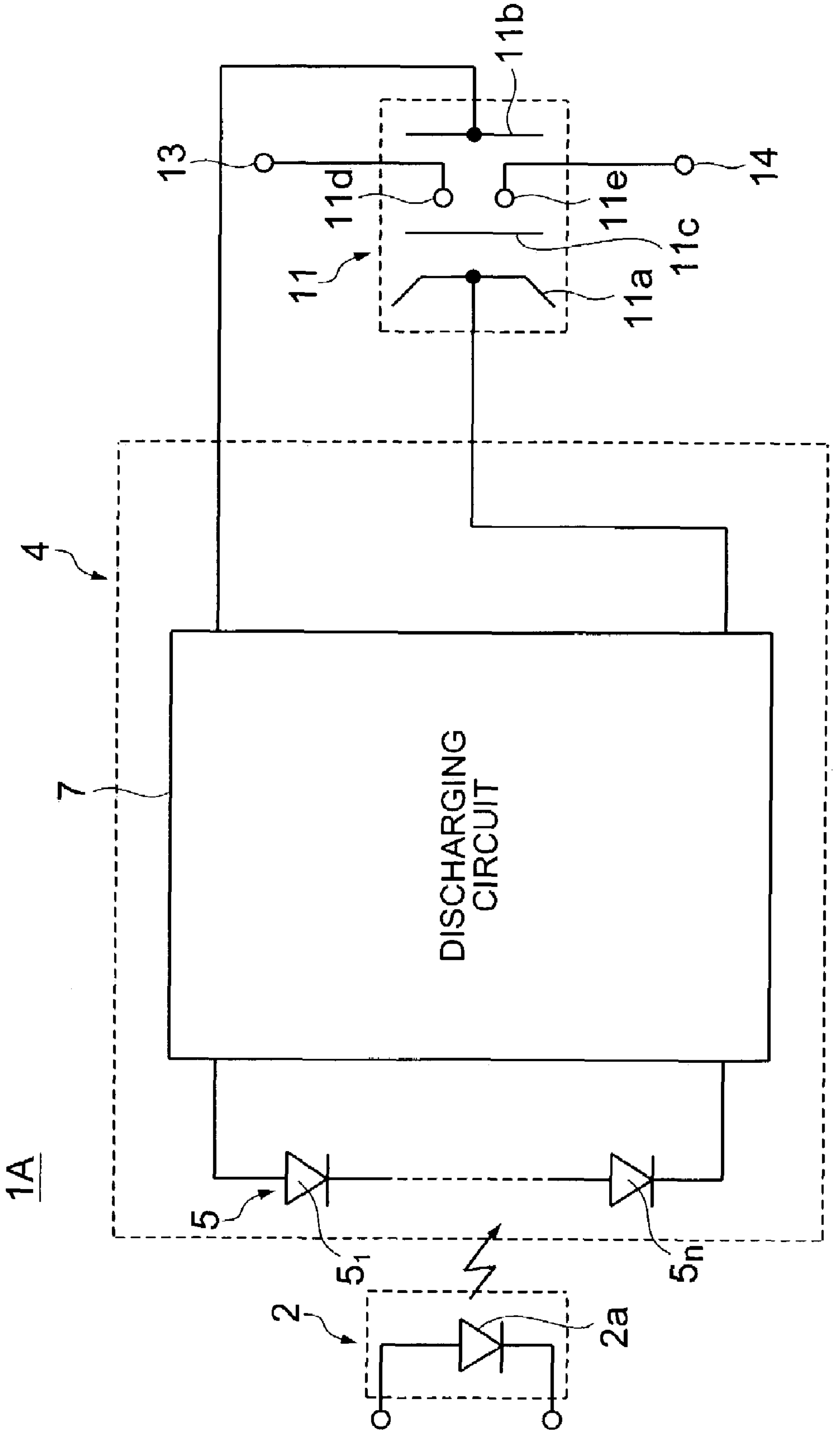
FIG. 2 shows a block diagram of a MEMS apparatus according to a second embodiment of the present invention.

Shown in FIG. 2 is a MEMS apparatus of a second embodiment according to the present invention.

A MEMS 1A shown in FIG. 2 is equivalent to the counterpart 1 shown in FIG. 1, except that the former is equipped with an RF-MEMS switch 11 instead of the MEMS 10.

The RF-MEMS switch 11, shown in FIG. 2, consists of two electrodes 11*a* and 11*b*, and a movable contact 11*c* and fixed contacts 11*d* and 11*e* provided between the electrodes 11*a* and 11*b*. The contacts 11*d* and 11*e* are connected to input and output terminals 13 and 14, respectively.

A high potential is applied to either of the electrode 11*a* and 11*b* whereas a low potential to the other.

The RF-MEMS switch 11 in this embodiment may be configured like the known counterpart shown in FIG. 13.

Figure 3:
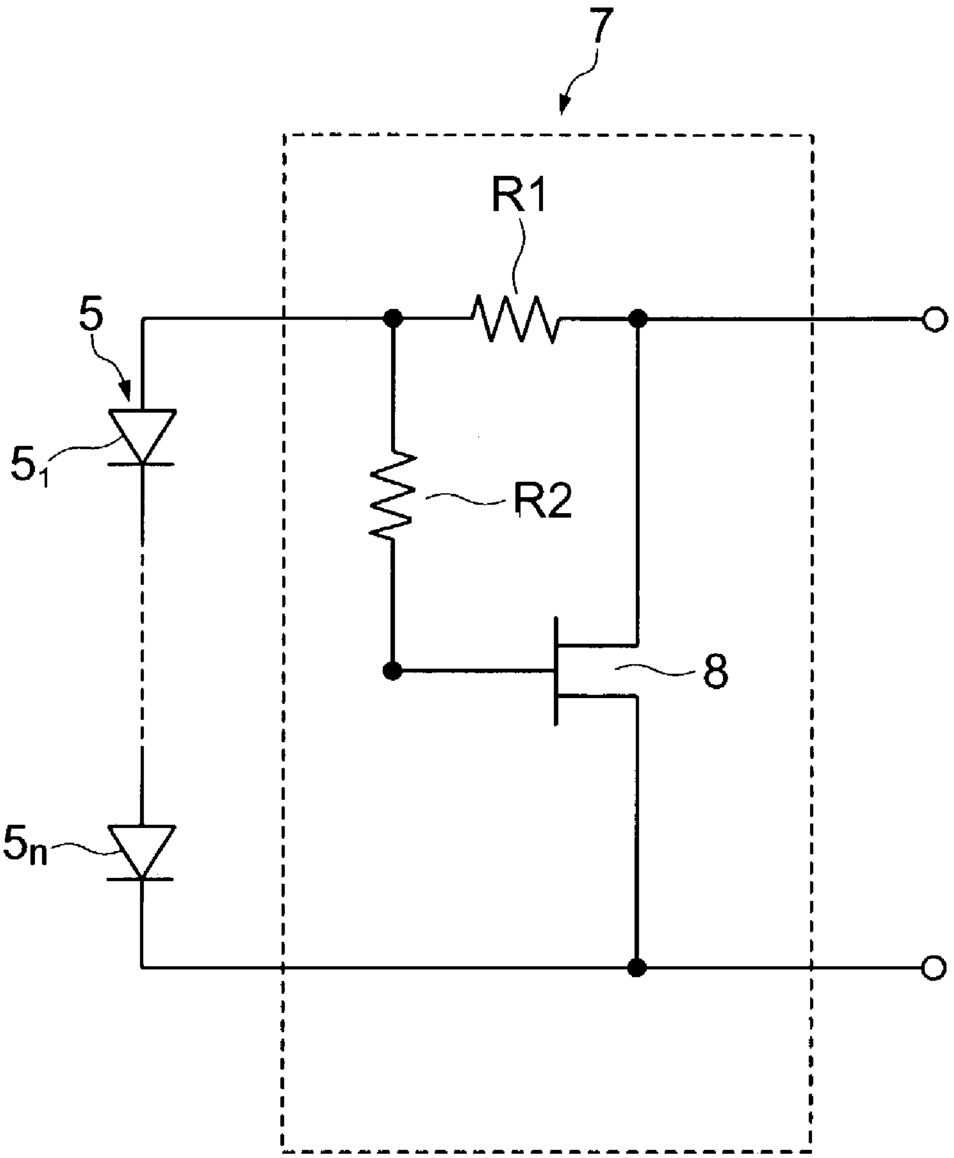
FIG. 3 shows an exemplary configuration of a discharging circuit according to the present invention.

An exemplary configuration of a discharging circuit 7 in this embodiment is shown in FIG. 3.

The discharging circuit 7 shown in FIG. 3 is equipped with a junction FET 8 and resistors R1 and R2.

The drain of the junction FET 8 is connected to the anode of a photo diode $\mathbf{5}_1$ of a light-receiving circuit 5 via a resistor R1. The gate of the junction FET 8 is also connected to the anode of the photo diode $\mathbf{5}_1$ via a resistor R2. The source of the junction FET 8 is connected to the cathode of a photo diode $\mathbf{5}_n$ of the light-receiving circuit 5.

The drain and the source of the junction FET 8 are further connected to electrodes 11*b* and 11*a*, respectively, of the RF-MEMS 11 shown in FIG. 2.

The junction FET 8 in this embodiment is a normally-on type which is turned off when a drive voltage is generated across the light-receiving circuit 5 due to light emission from the light-emitting circuit 2.

The drive voltage is applied to the electrodes 11*a* and 11*b* of the RF-MEMS switch 11 (FIG. 2) via a discharging circuit 7 shown in FIG. 3. The drive voltage makes the movable contact 11*c* touching the fixed contacts 11*d* and 11*e*, thus the RF-MEMS switch 11 being turned on, with the input terminal 13 and the output terminal 14 being electrically connected to each other.

No light emission from the light-emitting circuit 2 causes zero potential difference across the light-receiving circuit 5, which further causes zero potential to the gate of the junction FET 8 in the discharging circuit 7, thus the FET 8 being turned on.

The turned-on FET 8 makes the electrodes 11*a* and 11*b* being electrically connected to each other, thus the RF-MEMS switch 11 being turned off.

The RF-MEMS switch 11 in this embodiment is a normally-off type which is then turned on with a voltage across the electrodes 11*a* and 11*b*. It may, however, be a normally-on type which is turned off with a voltage across the electrodes 11*a* and 11*b*.

As disclosed above, like the first embodiment, the second embodiment achieves high reliability with less generation of noises, high voltage withstanding and generation of high-quality boosted voltage waveforms, with less number of components, compared to known power ICs.

[Third Embodiment]

Figure 4:
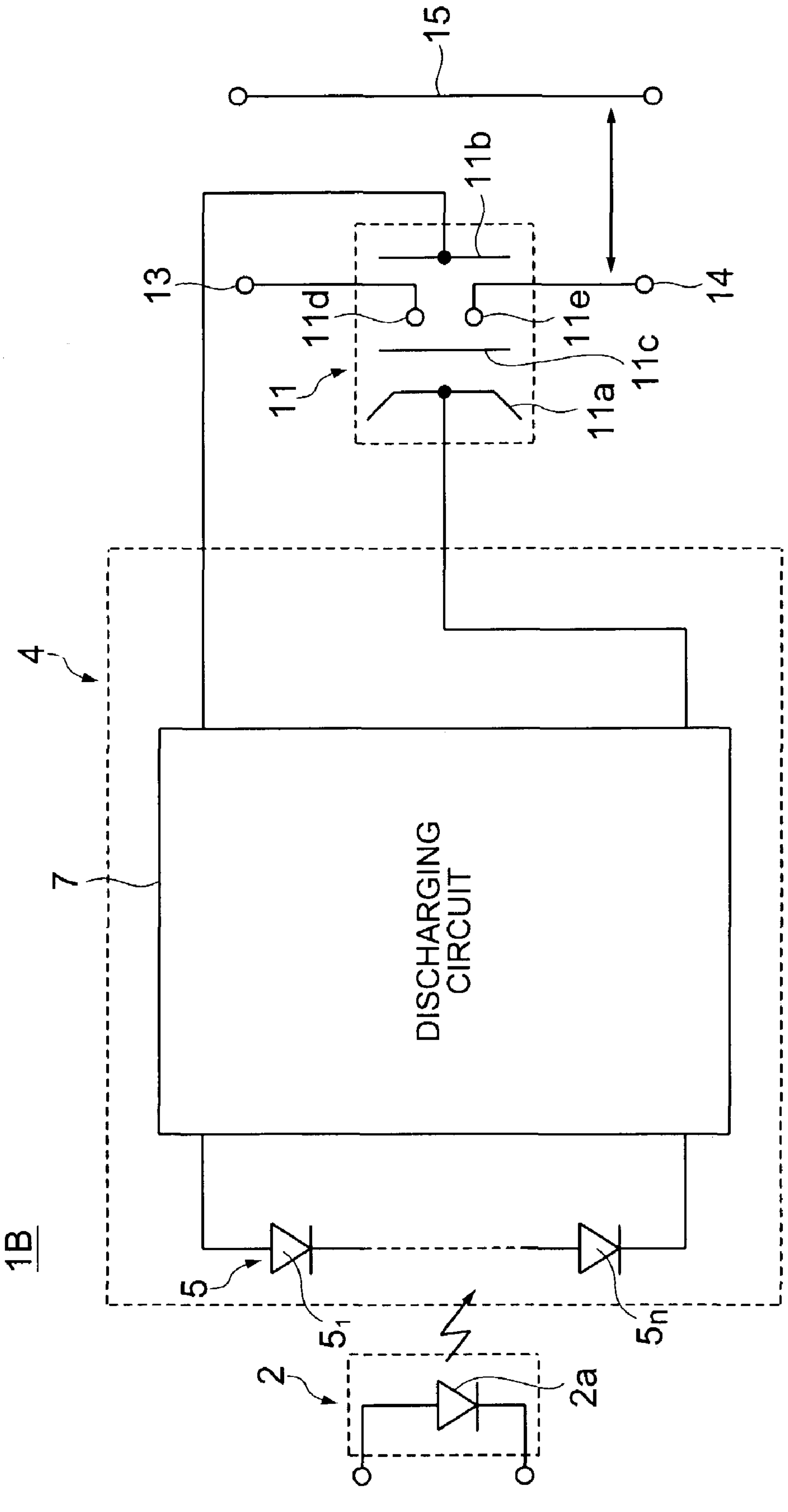
FIG. 4 shows a block diagram of a MEMS apparatus according to a third embodiment of the present invention.

Shown in FIG. 4 is a MEMS apparatus of a third embodiment according to the present invention.

A MEMS 1B in the third embodiment is equivalent to the counterpart 1A in the second embodiment, except that the former is equipped with a wiring 15 impedance matched with an RE-MEMS switch 11.

The third embodiment has the same advantages as those of the second embodiment, which is understandable with no detailed disclosure.

[Fourth Embodiment]

Figure 5:
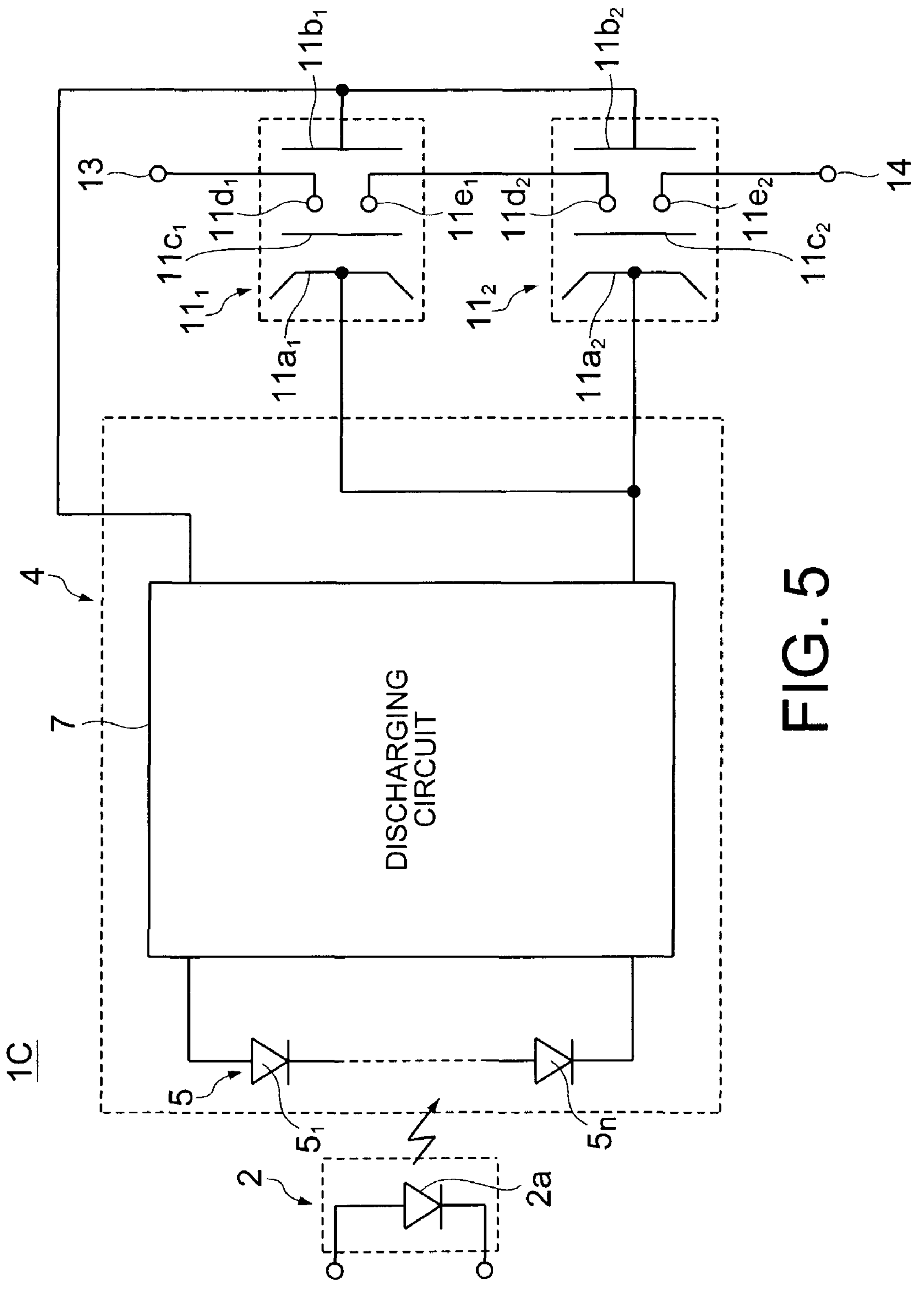
FIG. 5 shows a block diagram of a MEMS apparatus according to a fourth embodiment of the present invention.

Shown in FIG. 5 is a MEMS apparatus of a fourth embodiment according to the present invention.

A MEMS 1C in the fourth embodiment is equivalent to the counterpart 1A in the second embodiment, except that the former is equipped with series-connected RF-MEMS switches $\mathbf{11}_1$ and $\mathbf{11}_2$ instead of the MEMS 11.

The RF-MEMS switch $\mathbf{11}_1$ is a capacitive type having two electrodes $\mathbf{11}a_1$ and $\mathbf{11}b_2$, and a movable contact $\mathbf{11}c_1$ and fixed contacts $\mathbf{11}d_1$ and $\mathbf{11}e_1$ provided between the electrodes $\mathbf{11}a_1$ and $\mathbf{11}b_1$.

The RF-MEMS switch $\mathbf{11}_2$ is also a capacitive type having two electrodes $\mathbf{11}a_2$ and $\mathbf{11}b_2$, and a movable contact $\mathbf{11}c_2$ and fixed contacts $\mathbf{11}d_2$ and $\mathbf{11}e_2$ provided between the electrodes $\mathbf{11}a_2$ and $\mathbf{11}b_2$.

The contact $\mathbf{11}d_1$ is connected to an input terminal 13. The contact $\mathbf{11}e_1$ is connected to the contact $\mathbf{11}d_2$. The contact $\mathbf{11}e_2$ is connected to an output terminal 14.

A low potential is applied to the electrodes $\mathbf{11}a_1$ and $\mathbf{11}a_2$ connected to each other. A high potential is applied to the electrodes $\mathbf{11}b_1$ and $\mathbf{11}b_2$ connected to each other.

The series connection of the RF-MEMS switch $\mathbf{11}_1$ and $\mathbf{11}_2$ offers lower capacitance (higher frequency) characteristics.

Two RF-MEMS switches are connected in series in the fourth embodiment. However, three or more of RF-MEMS switches may be connected in series, which offers lower capacitance (higher frequency) characteristics than the fourth embodiment.

The fourth embodiment has the same advantages as those of the second embodiment.

[Fifth Embodiment]

Figure 6:
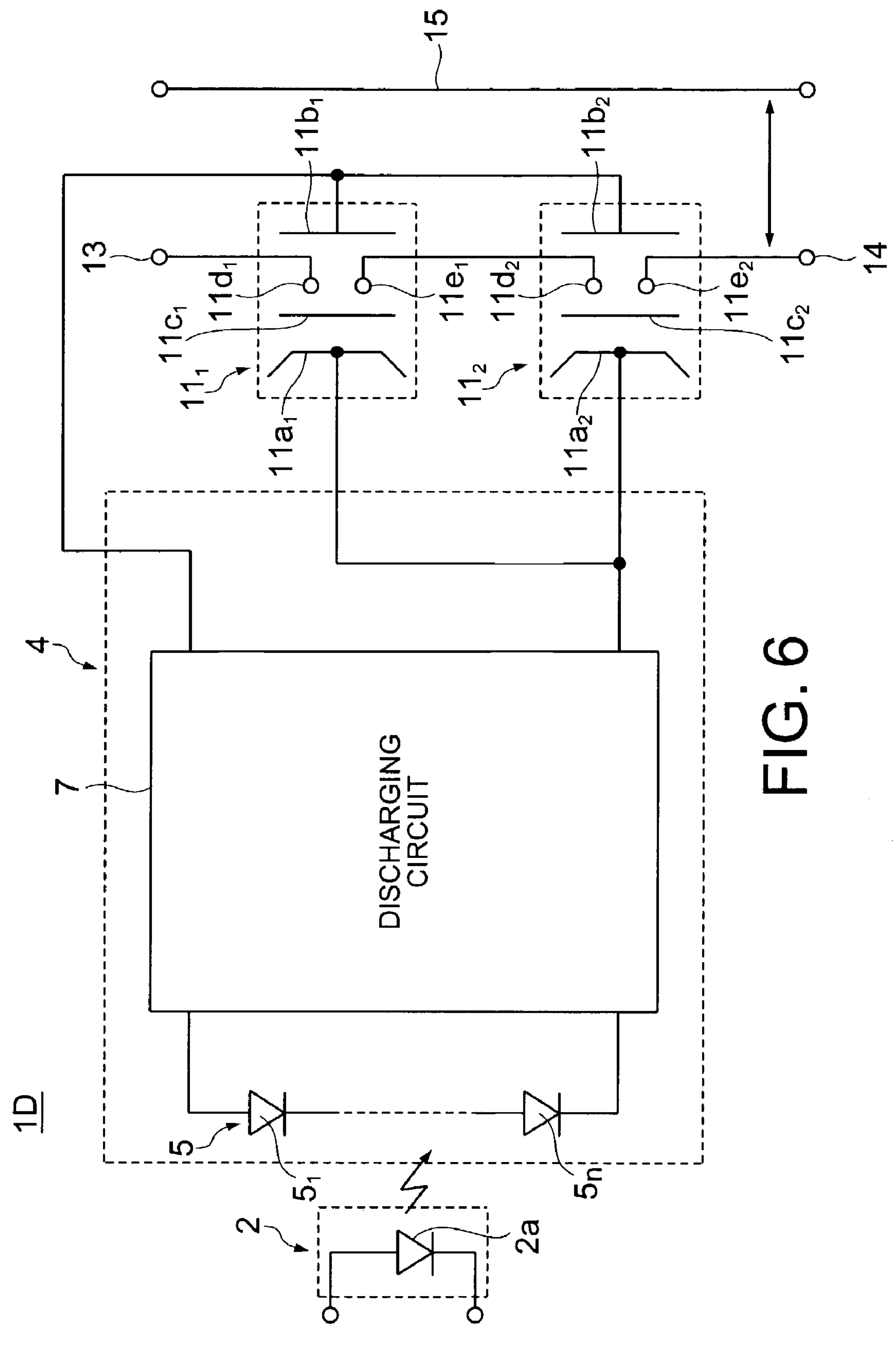
FIG. 6 shows a block diagram of a MEMS apparatus according to a fifth embodiment of the present invention.

Shown in FIG. 6 is a MEMS apparatus of a fifth embodiment according to the present invention.

A MEMS 1D in the fifth embodiment is equivalent to the counterpart 1C in the fourth embodiment, except that the former is equipped with a wiring 15 impedance matched with series-connected RE-MEMS switches $\mathbf{11}_1$ and $\mathbf{11}_2$.

The fifth embodiment has the same advantages as those of the fourth embodiment.

[Sixth Embodiment]

Figure 7:
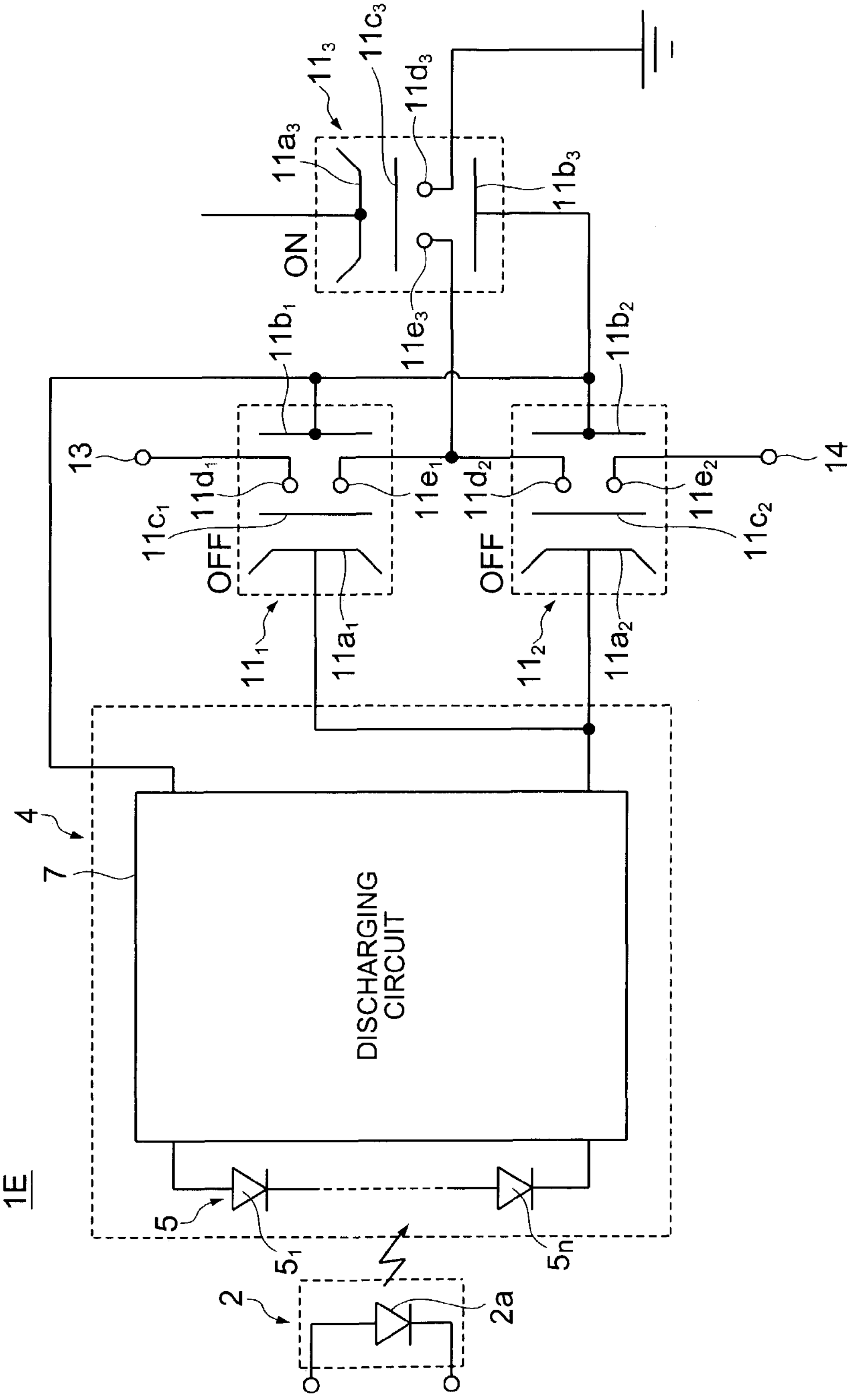
FIG. 7 shows a block diagram of a MEMS apparatus according to a sixth embodiment of the present invention.

Shown in FIG. 7 is a MEMS apparatus of a sixth embodiment according to the present invention.

A MEMS 1E in the seventh embodiment is equivalent to the counterpart 1C in the fourth embodiment, except that the former is equipped with an additional RE-MEMS switch $\mathbf{11}_3$.

The RF-MEMS switch $\mathbf{11}_3$ is a capacitive type having two electrodes $\mathbf{11}a_3$ and $\mathbf{11}b_3$, and a movable contact $\mathbf{11}c_3$ and fixed contacts $\mathbf{11}d_3$ and $\mathbf{11}e_3$ provided between the electrodes $\mathbf{11}a_3$ and $\mathbf{11}b_3$.

The contact $\mathbf{11}e_3$ is connected to the node at which a fixed contact $\mathbf{11}e_1$ of an RF-MEMS switch $\mathbf{11}_1$ and a fixed contact $\mathbf{11}d_2$ of an RF-MEMS switch $\mathbf{11}_2$ are connected to each other. The contact $\mathbf{11}d_3$ is connected to ground.

A high potential is applied to the electrode $\mathbf{11}b_3$ and also to electrode $\mathbf{11}b_1$ and $\mathbf{11}b_2$ connected to each other.

The sixth embodiment achieves high reliability with less generation of noises, like the four embodiment, and further lower capacitance (higher frequency) than the latter embodiment.

[Seventh Embodiment]

Figure 8:
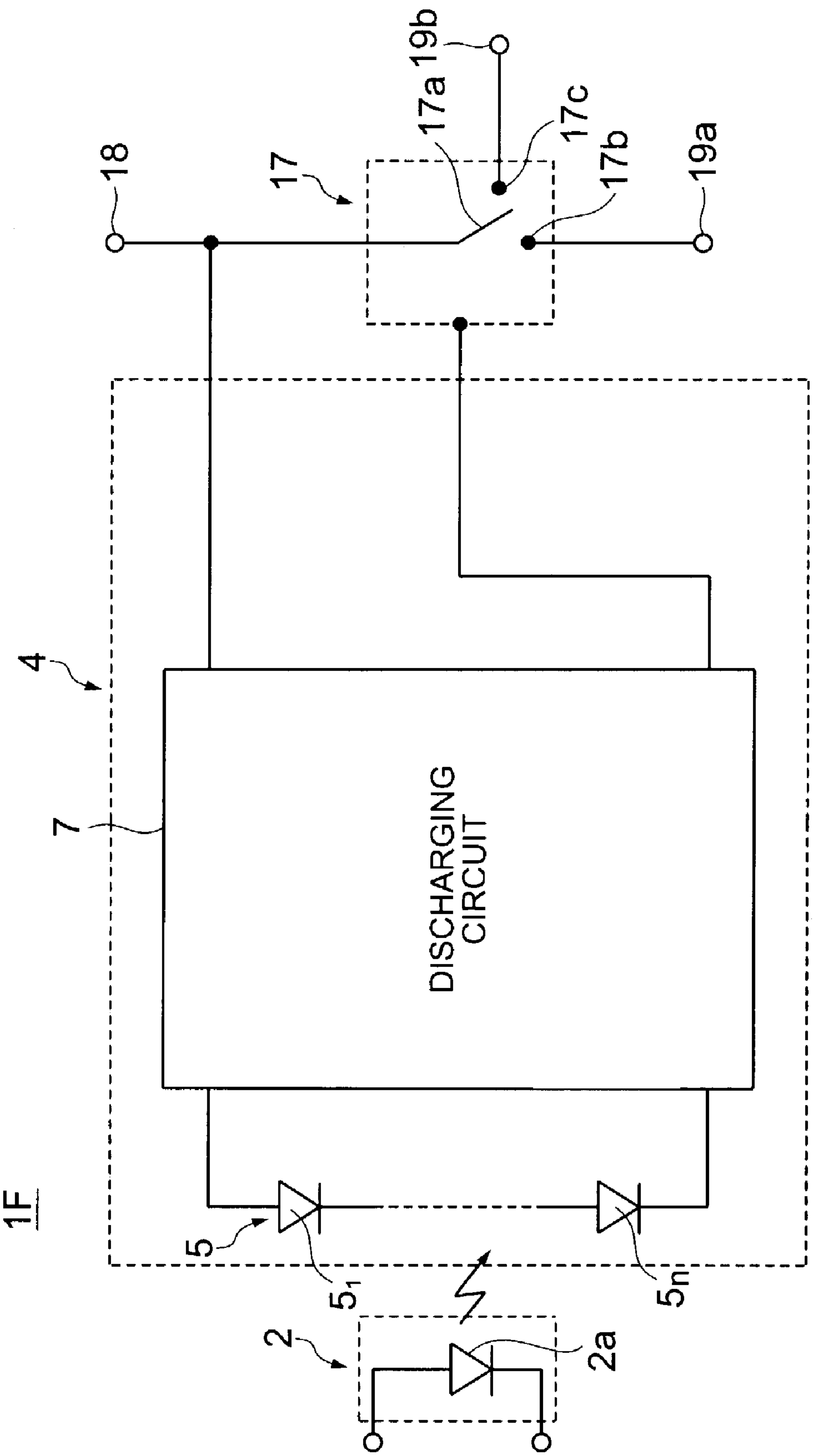
FIG. 8 shows a block diagram of a MEMS apparatus according to a seventh embodiment of the present invention.

Shown in FIG. 8 is a MEMS apparatus of a seventh embodiment according to the present invention.

A MEMS 1F in the seventh embodiment is equivalent to the counterpart 1A shown in FIG. 2, except that the former is equipped with an RF-MEMS switch 17 having a switching contact instead of the MEMS 10.

The RF-MEMS switch 17, shown in FIG. 8, consists of a movable contact 17*a* connected to an input terminal 18, a fixed contact 17*b* connected to an output terminal 19*a*, and a fixed contact 17*c* connected to an output terminal 19*b*. The input terminal 18 is connected to a high-potential terminal of a light-receiving circuit 5 via a discharging circuit 7.

The movable contact 17*a* of the RF-MEMS switch 17 is connected to either of the fixed contacts 17*b* and 17*c* when no voltage is generated across the light-receiving circuit 5. It is then switched to the other of the contacts 17*b* and 17*c* when a voltage is generated across the circuit 5 in response to light emitted from the light-emitting circuit 2.

Like the second embodiment, the seventh embodiment achieves high reliability with less generation of noises.

[Eighth Embodiment]

Figure 9:
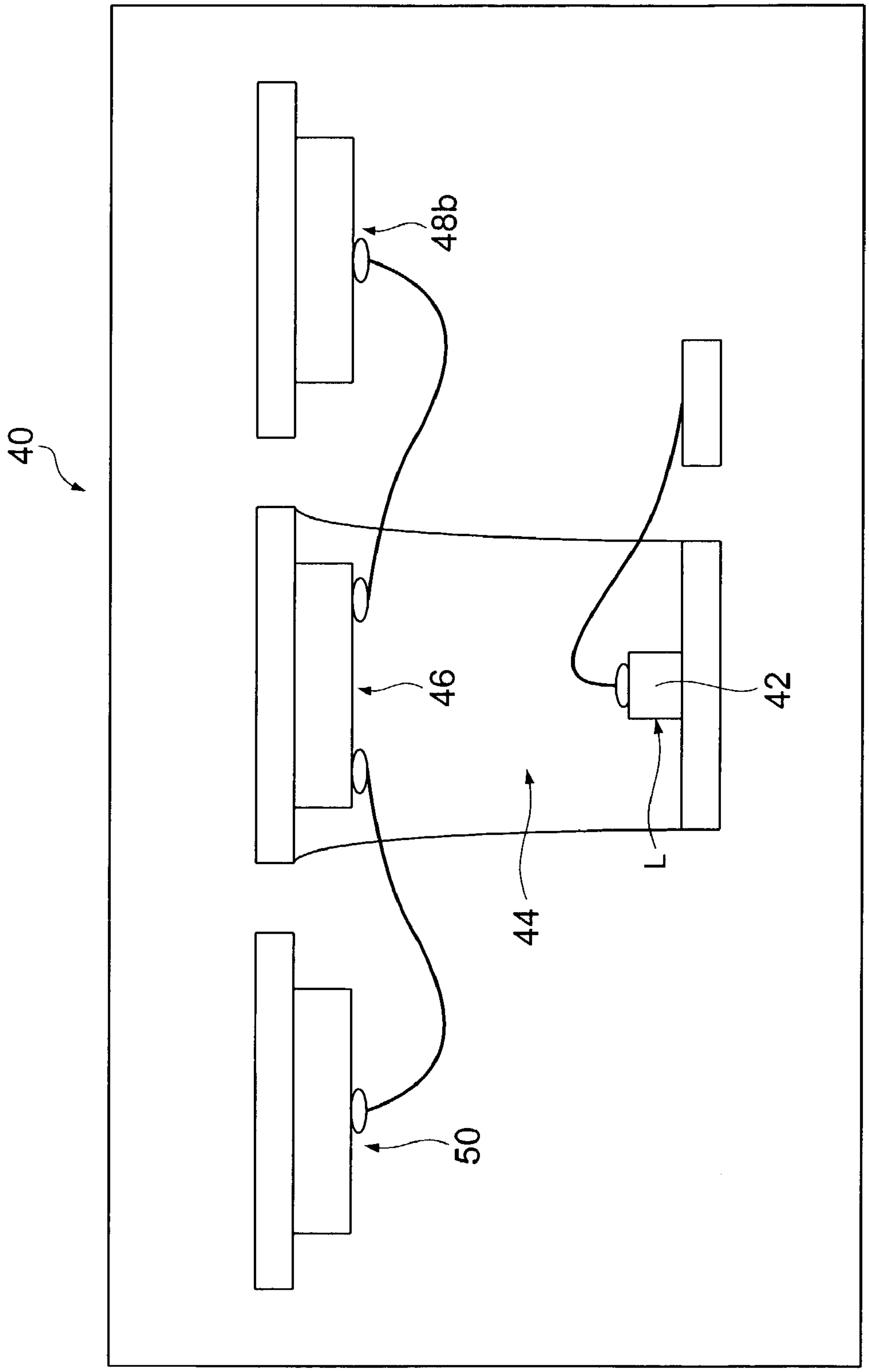
FIG. 9 shows a cross section of a MEMS apparatus according to an eighth embodiment of the present invention.

Shown in FIG. 9 is a MEMS apparatus of an eighth embodiment according to the present invention.

A MEMS apparatus 40 in the eighth embodiment is equipped with an LED chip 42, a silicon optical tube 44, an MOSFET drive chip 46, and MEMS chips 48 and 50. Each MEMS chip has a MEMS formed therein and electrically connected to the MOSFET drive chip 46. All of these components are fabricated in a package.

The LED chip 42 has a light-emitting circuit 2, formed therein, equivalent to the counterparts 2 in the first to the seventh embodiments.

The MOSFET drive chip 46 has a light-receiving circuit 5 and a discharging circuit 7, formed therein, equivalent to the counter parts 5 and 7, respectively, in the first to the seventh embodiments.

The light-emitting circuit 2 and the light-receiving circuit 5 are optically coupled through the silicon optical tube 44 so that light emitted from the former circuit 2 reaches the latter circuit 5 with almost no leakage.

The LED chip 42 and the MOSFET drive chip 46 are vertically facing each other in this embodiment. These chips may, however, be aligned on the same plane and optically coupled each other through the silicon optical tube 44.

Like the first embodiment, the eighth embodiment achieves high reliability with less generation of noises.

[Ninth Embodiment]

Figure 10:
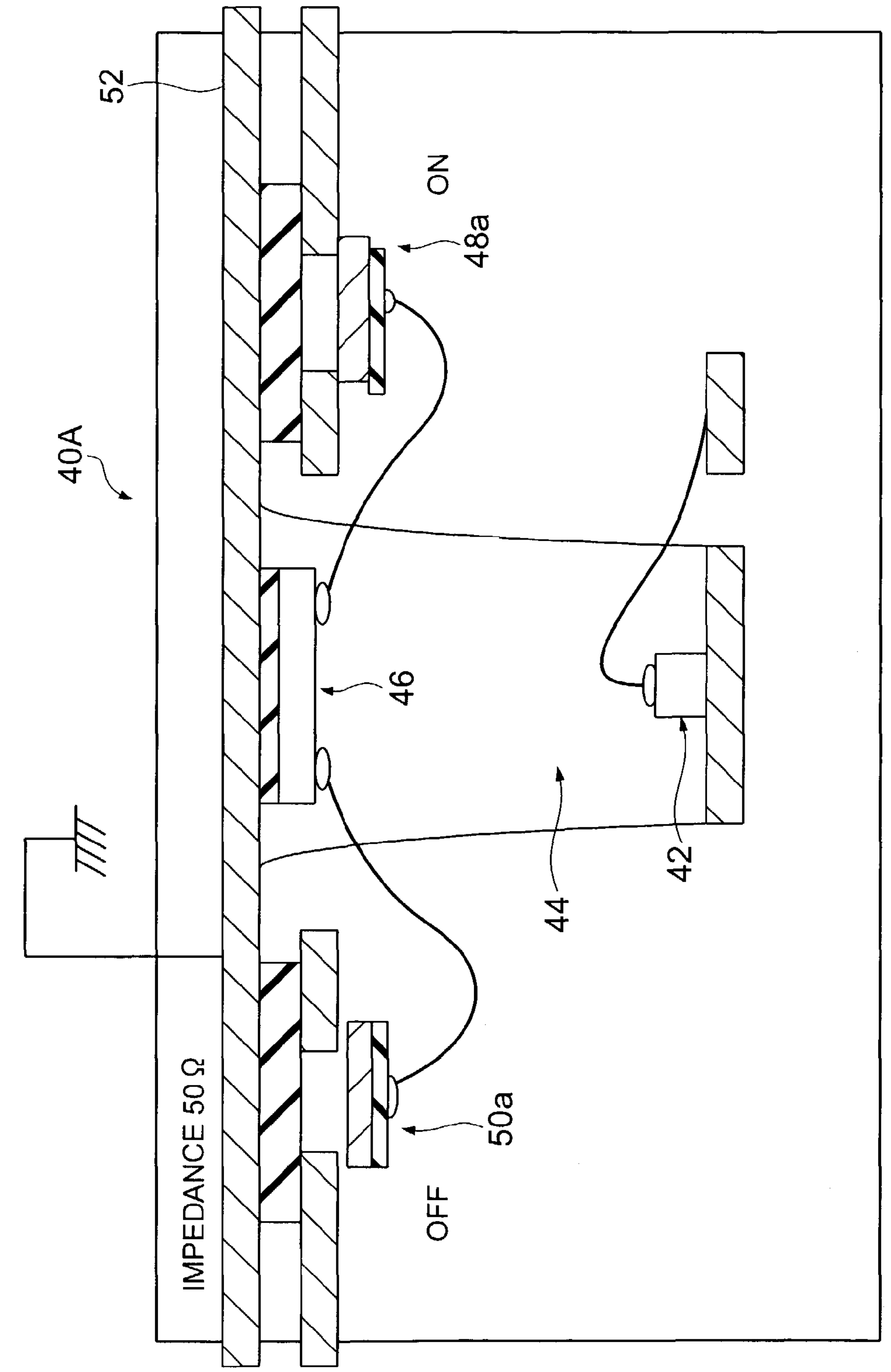
FIG. 10 shows a cross section of a MEMS apparatus according to a ninth embodiment of the present invention.

Shown in FIG. 10 is a MEMS apparatus of a ninth embodiment according to the present invention.

A MEMS apparatus 40A in the ninth embodiment is equipped with an LED chip 42, a silicon optical tube 44, an MOSFET drive chip 46, MEMS chips 48*a* and 50*a*, each MEMS chip having a MEMS formed therein and electrically connected to the MOSFET drive chip 46, and a wiring 52 grounded and impedance matched with the chips 46, 48*a* and 50*a*. All of these components are fabricated in a package.

The LED chip 42 has a light-emitting circuit 2, formed therein, equivalent to the counterparts 2 in the first to the seventh embodiments.

The MOSFET drive chip 46 has a light-receiving circuit 5 and a discharging circuit 7, formed therein, equivalent to the counterparts 5 and 7, respectively, in the first to the seventh embodiments.

The light-emitting circuit 2 and the light-receiving circuit 5 are optically coupled through the silicon optical tube 44 so that light emitted from the former circuit 2 reaches the latter circuit 5 with almost no leakage.

The LED chip 42 and the MOSFET drive chip 46 are vertically facing each other in this embodiment. These chips may, however, be aligned on the same plane and optically coupled each other through the silicon optical tube 44.

The MEMS switch in the MEMS chip 48*a* is on while that in the MEMS chip 50*a* is off; conversely, the former is off while the latter is on.

Like the first embodiment, the ninth embodiment achieves high reliability with less generation of noises.

[Tenth Embodiment]

Figure 11:
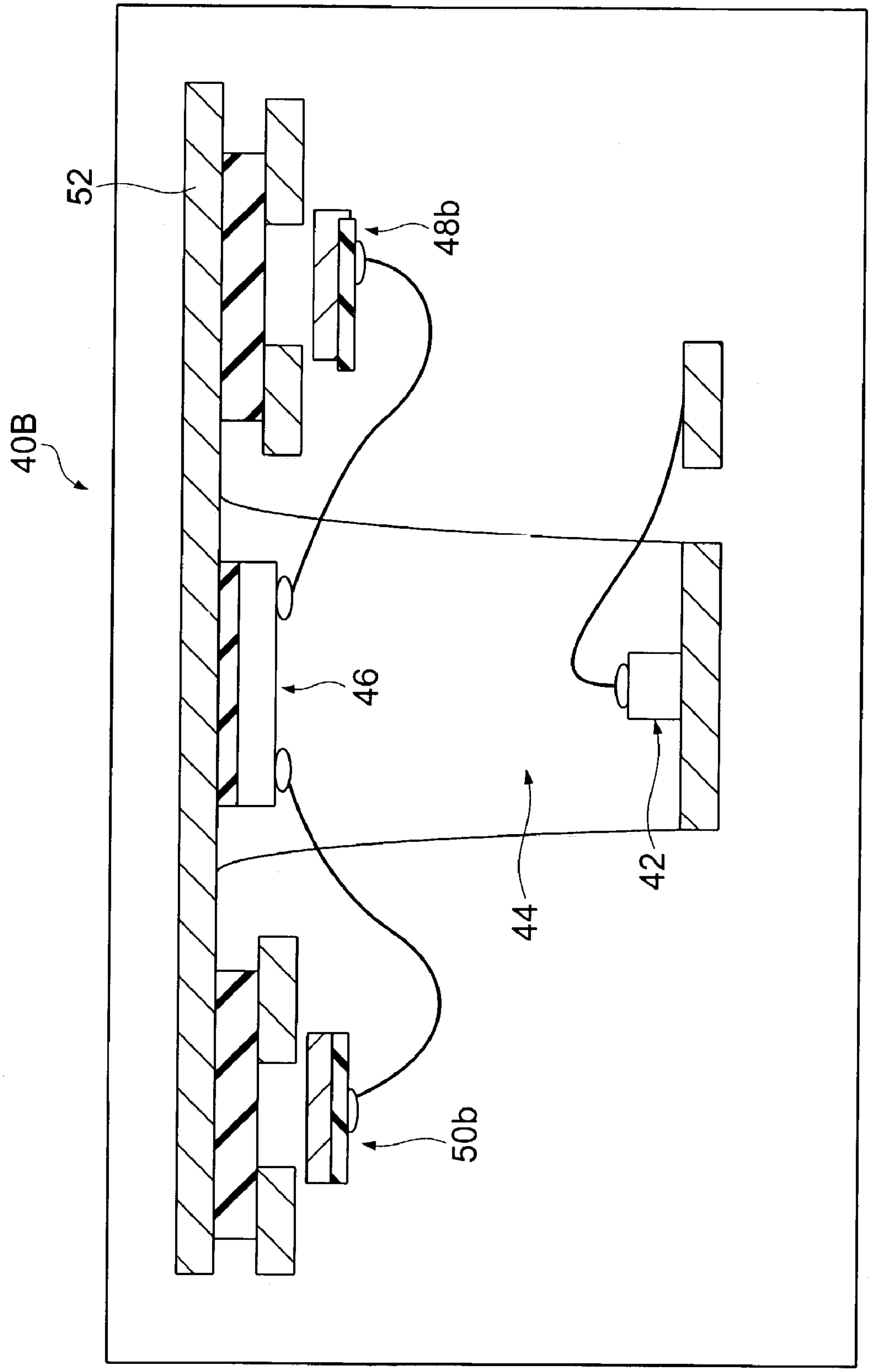
FIG. 11 shows a cross section of a EMS apparatus according to a tenth embodiment of the present invention.
Figure 12:
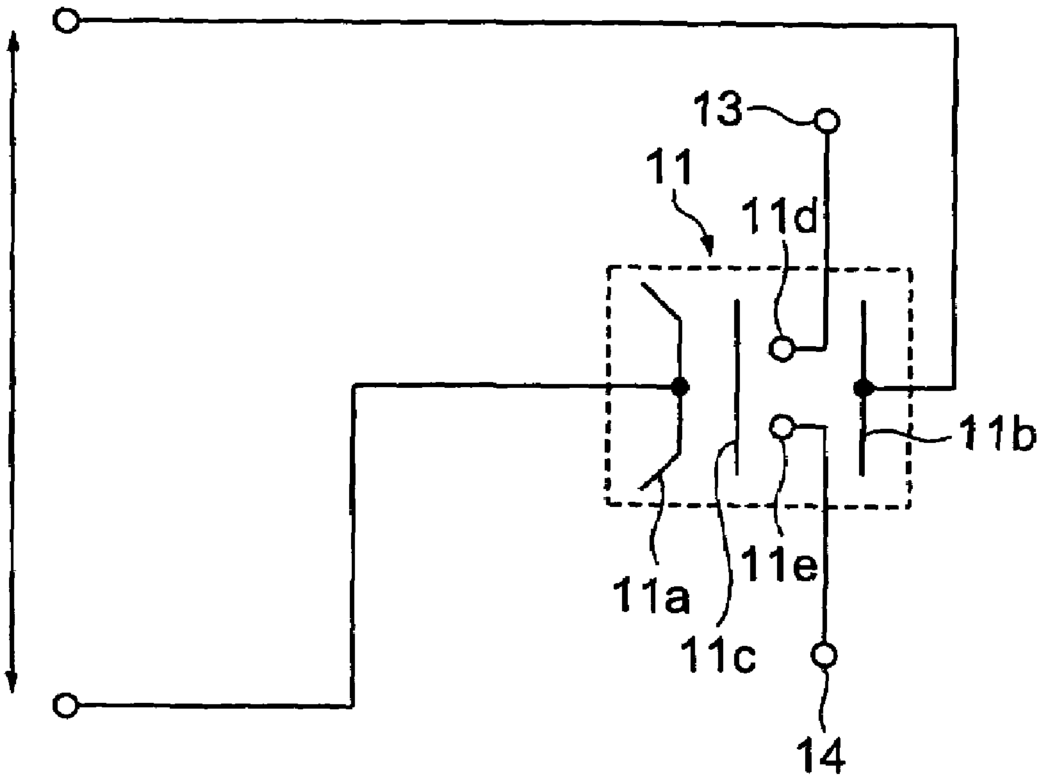
FIG. 12 PRIOR ART
FIG. 12 shows a conventional configuration of an RF-MEMS switch.
Figure 13A:
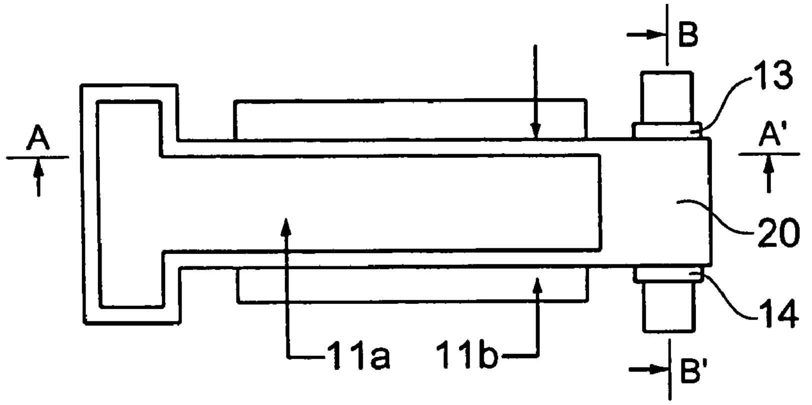
FIG. 13A PRIOR ART
FIG. 13A shows a plan view of a detailed configuration of an RF-MEMS switch.
Figure 13B:
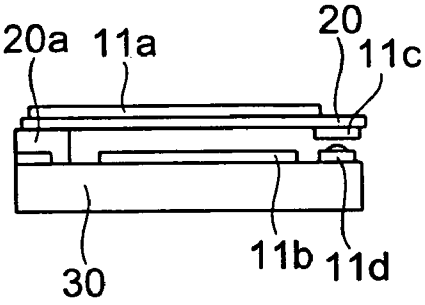
FIG. 13B PRIOR ART
FIG. 13B shows a cross section of the RF-MEMS switch taken on line A–A' in FIG. 13A.
Figure 13C:
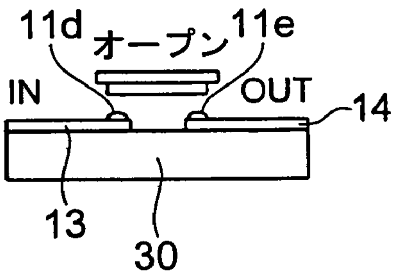
FIG. 13C PRIOR ART
FIG. 13C shows a cross section of the RF-MEMS switch taken on line B–B' in FIG. 13A.
Figure 13D:
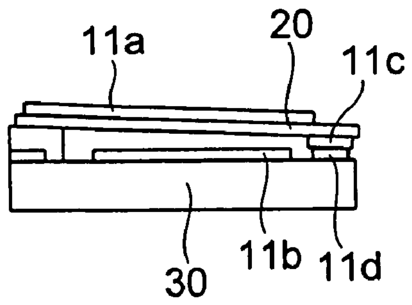
FIG. 13D PRIOR ART
FIG. 13D shows a cross section of the RF-MEMS switch taken on line A–A' in FIG. 13A.
Figure 13E:
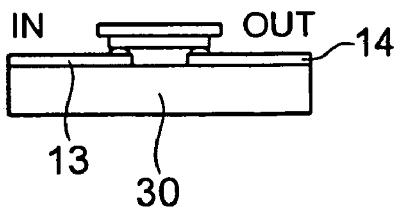
FIG. 13E PRIOR ART
FIG. 13E shows a cross section of the RF-MEMS switch taken on line B–B' in FIG. 13A.

Shown in FIG. 11 is a MEMS apparatus of a tenth embodiment according to the present invention.

A MEMS apparatus 40B in the tenth embodiment is equipped with an LED chip 42, a silicon optical tube 44, an MOSFET drive chip 46, MEMS chips 48*b* and 50*b*, each MEMS chip having a MEMS formed therein and electrically connected to the MOSFET drive chip 46, and a wiring 52 grounded and impedance matched with the chips 46, 48*b* and 50*b*. All of these components are fabricated in a package.

The LED chip 42 has a light-emitting circuit 2, formed therein, equivalent to the counterparts 2 in the first to the seventh embodiments.

The MOSFET drive chip 46 has a light-receiving circuit 5 and a discharging circuit 7, formed therein, equivalent to the counterparts 5 and 7, respectively, in the first to the seventh embodiments.

The light-emitting circuit 2 and the light-receiving circuit 5 are optically coupled through the silicon optical tube 44 so that light emitted from the former circuit 2 reaches the latter circuit 5 with almost no leakage.

The LED chip 42 and the MOSFET drive chip 46 are vertically facing each other in this embodiment. These chips may, however, be aligned on the same plane and optically coupled each other through the silicon optical tube 44.

The MEMS switches in the MEMS chips 48*b* and 50*b* are turned on or off at the same time.

Like the first embodiment, the tenth embodiment achieves high reliability with less generation of noises.

[Eleventh Embodiment]

Figure 14:
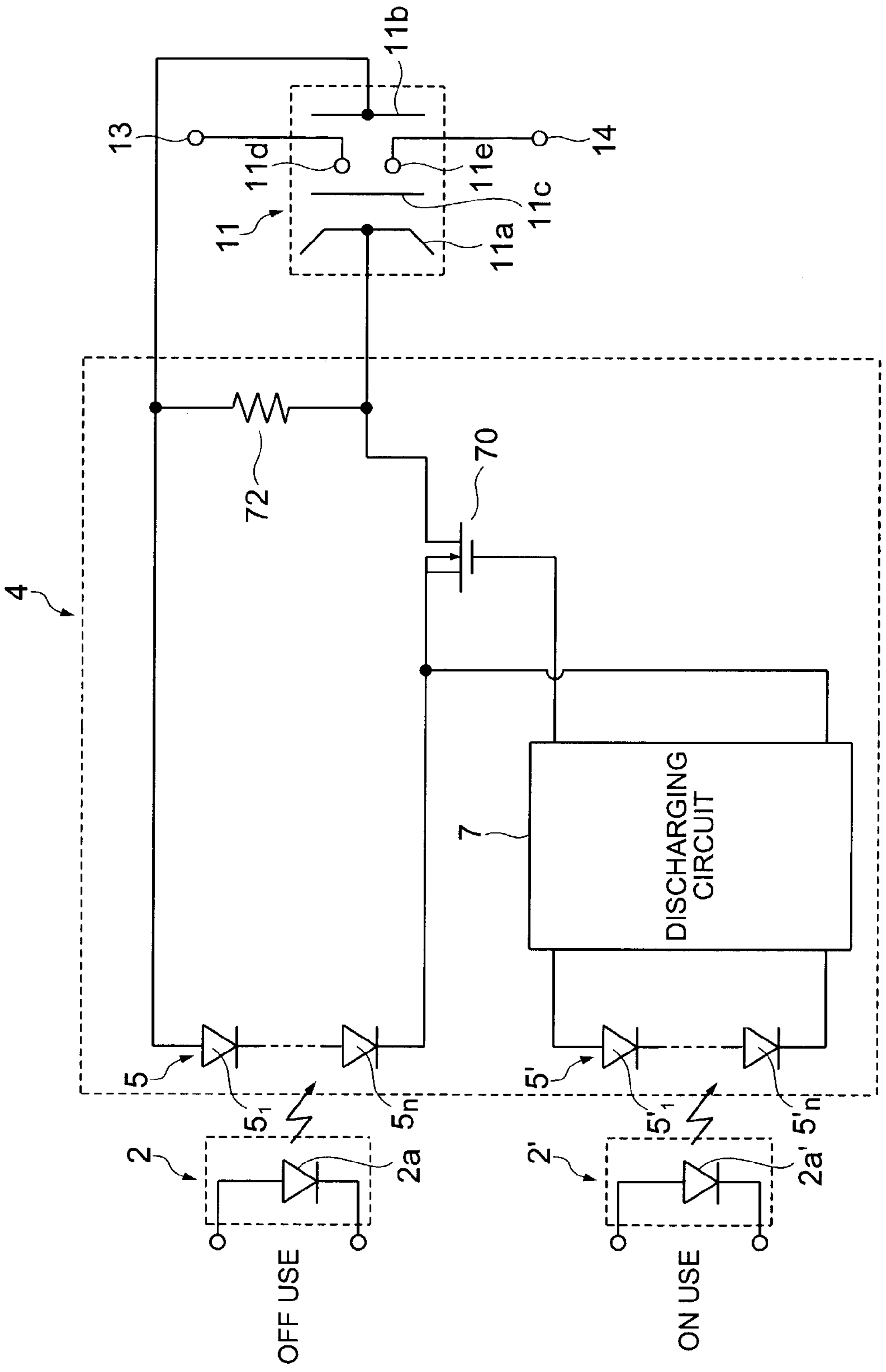
FIG. 14 shows a block diagram of a MEMS apparatus according to an eleventh embodiment of the present invention.

Shown in FIG. 14 is a MEMS apparatus of an eleventh embodiment according to the present invention.

A MEMS apparatus in the eleventh embodiment is equipped with a light-emitting circuit 2', a light-receiving circuit 5', a MOS switch 70, and a resistor 72, in addition to the components the same as those in the second embodiment.

The light-emitting circuit 2' has a light-emitting device 2*a*, such as, an LED (Light-Emitting Diode) or an LD (laser Diode). The light-receiving circuit 5' has series-connected photo diodes $\mathbf{5}_1$, . . . , and $\mathbf{5}_n$.

The gate of the MOS switch 70 is connected to a high-potential terminal of the light-receiving circuit 5' via a discharging circuit 7. Either of the source and drain of the MOS switch 70 is connected to a low-potential terminal of a light-receiving circuit 5, the other connected to a electrode 11*a* of an RF-MEMS switch 11.

The resistor 12 is connected across the RF-MEMS switch 11 at the electrode 11*a* and another electrode 11*b*.

Light emitted from the light-emitting circuit 2 causes generation of a high voltage across the light-receiving circuit 5. An off-state MOS switch 70, however, gives the same level of potential to the electrodes 11*a* and 11*b* of the RF-MEMS switch 11, thus charges being stored therebetween at the same level.

The same-level charges cause electrostatic repulsion to a movable contact 11*c* to make wide the distance between the movable contact 11*c* and fixed contacts 11*d* and 11*e*, thus offering a far more complete off-state to the RF-MEMS switch 11.

Light emission from the light-emitting circuit 2' to the light-receiving circuit 5' during the off-state of the RF-MEMS switch 11 causes generation of a high voltage across the circuit 5'.

The high voltage is applied to the gate of the MOS switch 70 via the discharging circuit 7, thus the MOS switch 70 being turned on.

The turned-on MOS switch 70 allows a current flowing through the resistor 72, thus charges being stored at different levels between the electrodes 11*a* and 11*b* of the RF-MEMS switch 11.

The different levels of charges cause electrostatic attraction to the movable contact 11*c* to make the contact 11*c* touching the fixed contacts 11*d* and 11*e*, thus offering a complete on-state to the RF-MEMS switch 11.

Like the second embodiment, the eleventh embodiment achieves high reliability with less generation of noises.

The electrostatic-repulsion/attraction switching circuitry added to the several RF-MEMS apparatus disclosed above offers fur accurate and reliable MEMS operations.

The electrostatic-repulsion/attraction switching circuitry or configuration can be applied to MEMS mirrors, MEMS actuators, and soon, in addition to the RF-MEMS apparatus, for high MEMS reliability.

[Twelfth Embodiment]

Figure 15:
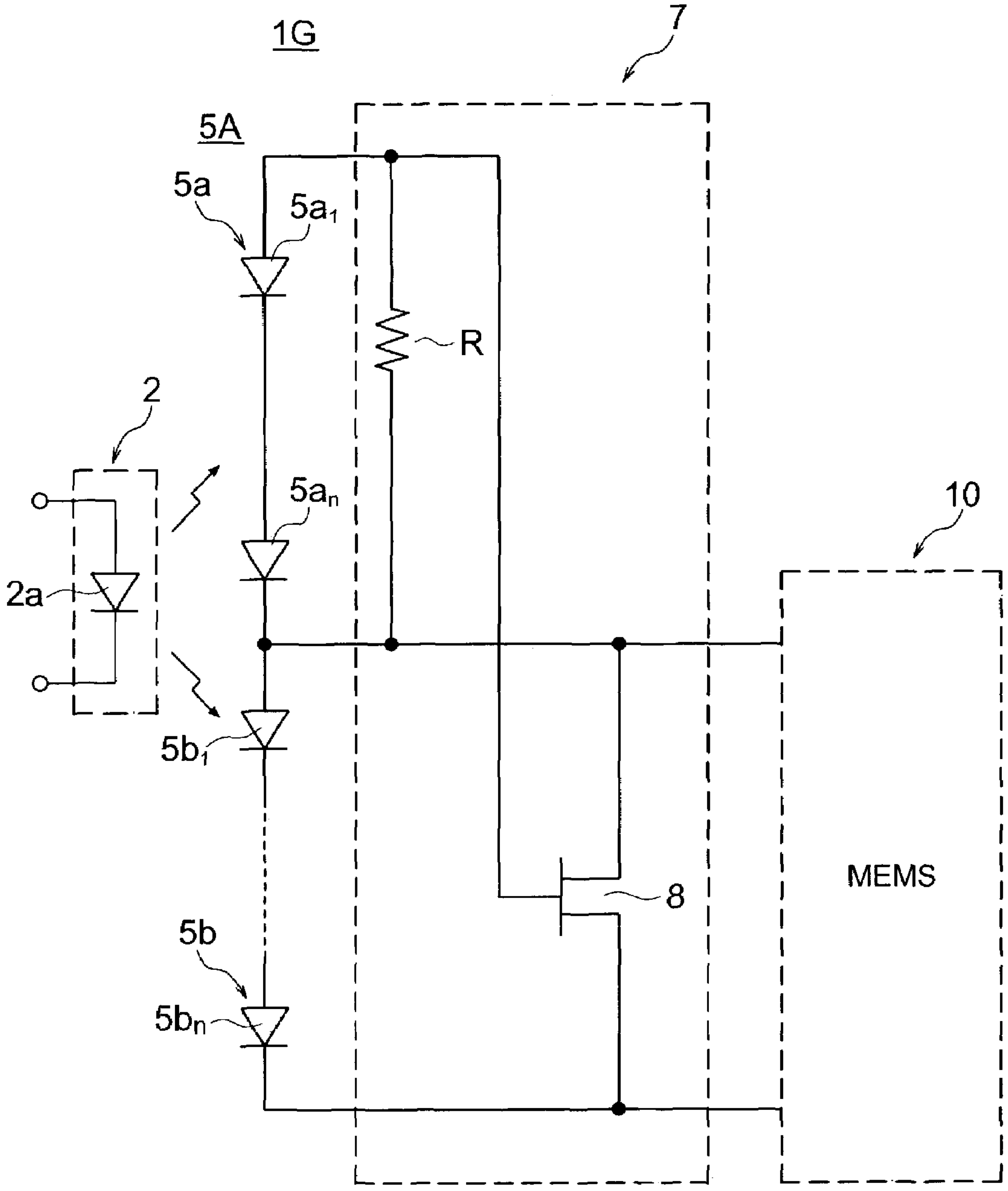
FIG. 15 shows a circuit of a MEMS apparatus according to a twelfth embodiment of the present invention.

Shown in FIG. 15 is a MEMS apparatus of a twelfth embodiment according to the present invention.

A MEMS 1G shown in FIG. 15 is equivalent to the counterpart 1A shown in FIG. 2, except that the former is equipped with a light-receiving unit 5A instead of the light-receiving circuit 5.

The light-receiving unit 5A is equipped with a discharge-control light-receiving circuit 5*a* and a MEMS-control light-receiving circuit 5*b*.

The discharge-control light-receiving circuit 5*a* has series-connected photo diodes $\mathbf{5}_{a1}$, . . . , and $\mathbf{5}_{an}$. The MEMS-control light-receiving circuit 5*b* has series-connected photo diodes $\mathbf{5}_{b1}$, . . . , and $\mathbf{5}_{bn}$.

The light-receiving circuits 5*a* and 5*b* are connected in series in which the cathode of the photo diode $\mathbf{5}_{an}$ of the former circuit is connected to the anode of the photo diodes $\mathbf{5}_{b1}$ of the latter circuit.

Light from a light-emitting circuit 2 is transmitted to both of the light-receiving circuits 5*a* and 5*b*.

A discharging circuit 7 is equipped with a junction FET 8 and a resistor R that is connected in parallel to the discharge-control light-receiving circuit 5*a*.

The drain of the junction FET 8 is connected to the anode of the photo diodes $\mathbf{5}_{b1}$ of the MEMS-control light-receiving circuit 5*b*. The anode of the photo diodes $\mathbf{5}_{b1}$ is the node of the light-receiving circuits 5*a* and 5*b*.

The gate of the junction FET 8 is connected to the anode of the photo diode $\mathbf{5}_{a1}$ of the discharge-control light-receiving circuit 5*a*.

The source of the junction FET 8 is connected to the cathode of the photo diode $\mathbf{5}_{bn}$ of the MEMS-control light-receiving circuit 5*b*.

Moreover, the drain and source of the junction FET 8 are connected to electrodes 11*b* and 11*a*, respectively, of a MEMS 10 equivalent to the counterpart 10 shown in FIG. 2.

The junction FET 8 in this embodiment is a normally-on type which is turned off when a drive voltage is generated across the light-receiving circuits 5*a* and 5*b* due to light emission from the light-emitting circuit 2.

The drive voltage is applied to the electrodes 11*a* and 11*b* of the RF-MEMS switch 11 via a discharging circuit 7. Like shown in FIG. 2, the drive voltage makes a movable contact 11*c* touching fixed contacts 11*d* and 11*e*, thus the RF-MEMS switch 11 being turned on, with an input terminal 13 and an output terminal 14 being electrically connected to each other.

No light emission from the light-emitting circuit 2 causes zero potential difference across the light-receiving circuits 5*a* and 5*b*, which further causes zero potential to the gate of the junction FET 8 in the discharging circuit 7, thus the FET 8 being turned on.

The turned-on FET 8 makes the electrodes 11*a* and 11*b* being electrically connected to each other, thus the RF-MEMS switch 11 being turned off.

The RF-MEMS switch 11 in this embodiment is a normally-off type which is then turned on with a voltage across the electrodes 11*a* and 11*b*. It may, however, be a normally-on type which is turned off with a voltage across the electrodes 11*a* and 11*b*.

The light-receiving unit 5A consists of two light-receiving circuits connected in series in this embodiment. It may, however, consist of three or more of light-receiving circuits connected in series.

As disclosed above, like the second embodiment, the twelfth embodiment achieves high reliability with less generation of noises, high voltage withstanding and generation of high-quality boosted voltage waveforms, with less number of components, compared to known power ICs.

[Thirteenth Embodiment]

Figure 16:
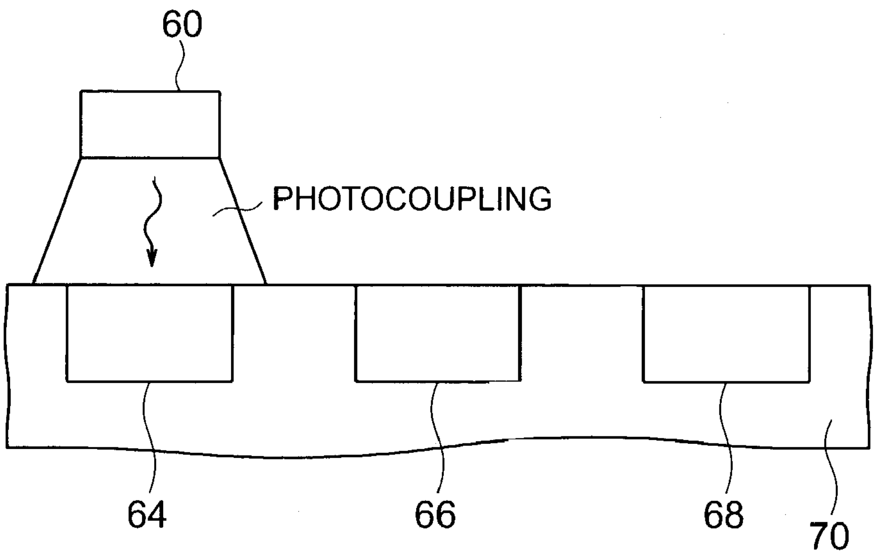
FIG. 16 shows a cross section of a MEMS apparatus according to a thirteenth embodiment of the present invention.

Shown in FIG. 16 is a cross section of a MEMS apparatus of a thirteenth embodiment according to the present invention.

A MEMS apparatus in this embodiment is equipped with a light-emitting device 60, a photocoupler 62, a light-receiving device 64, a controller 66 having a discharging circuit, and a MEMS 68.

The light-receiving device 64, the controller 66, and the MEMS 68 are fabricated on a semiconductor chip 70, except the light-emitting device 60.

The light-emitting device 60 is connected to the light-receiving device 64 through the photocoupler 62 which may be a silicon optical tube.

The light-emitting device 60 may be an LED, an organic EL, a silicon-based light-emitting device, etc.

Light emitted from the light-emitting device 60 is converted into a voltage by the light-receiving device 64. The voltage is applied to the controller 66 to control the MEMS 68.

As disclosed above, this embodiment also achieves high reliability with less generation of noises.

[Fourteenth Embodiment]

Figure 17:
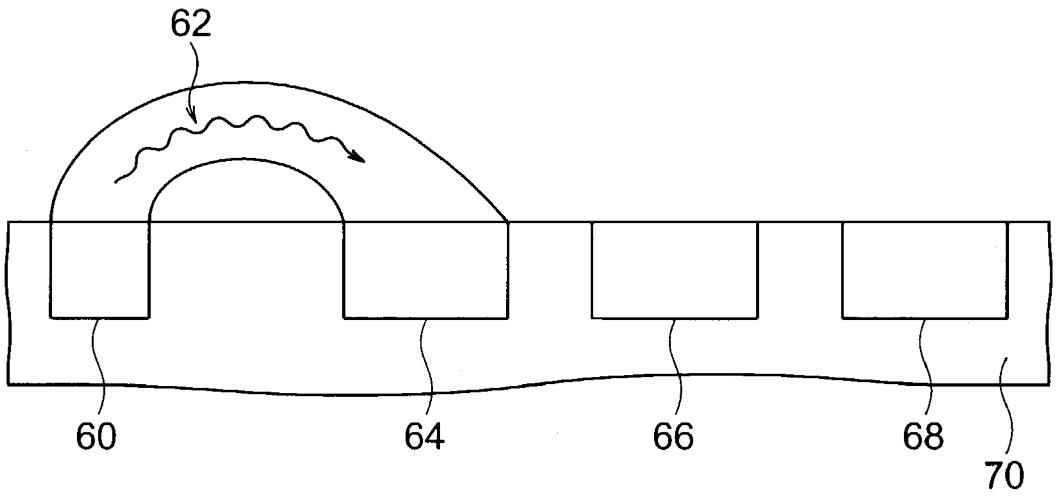
FIG. 17 shows a cross section of a MEMS apparatus according to a fourteenth embodiment of the present invention.

Shown in FIG. 17 is a cross section of a MEMS apparatus of a fourteenth embodiment according to the present invention.

A MEMS apparatus in this embodiment is equipped with a light-emitting device 60, a photoguide 62, a light-receiving device 64, a controller 66 having a discharging circuit, and a MEMS 68.

The light-emitting device 60, the light-receiving device 64, the controller 66, and the MEMS 68 are fabricated on a semiconductor chip 70.

The light-emitting device 60 is connected to the light-receiving device 64 through the photoguide 62.

The light-emitting device 60 may be an LED, an organic EL, a silicon-based light-emitting device, etc.

Light emitted from the light-emitting device 60 is transmitted to the light-receiving device 64 through the photoguide 62. The transmitted light is converted into a voltage by the light-receiving device 64. The voltage is applied to the controller 66 to control the MEMS 68.

As disclosed above, this embodiment also achieves high reliability with less generation of noises.

[Fifteenth Embodiment]

Figure 18:
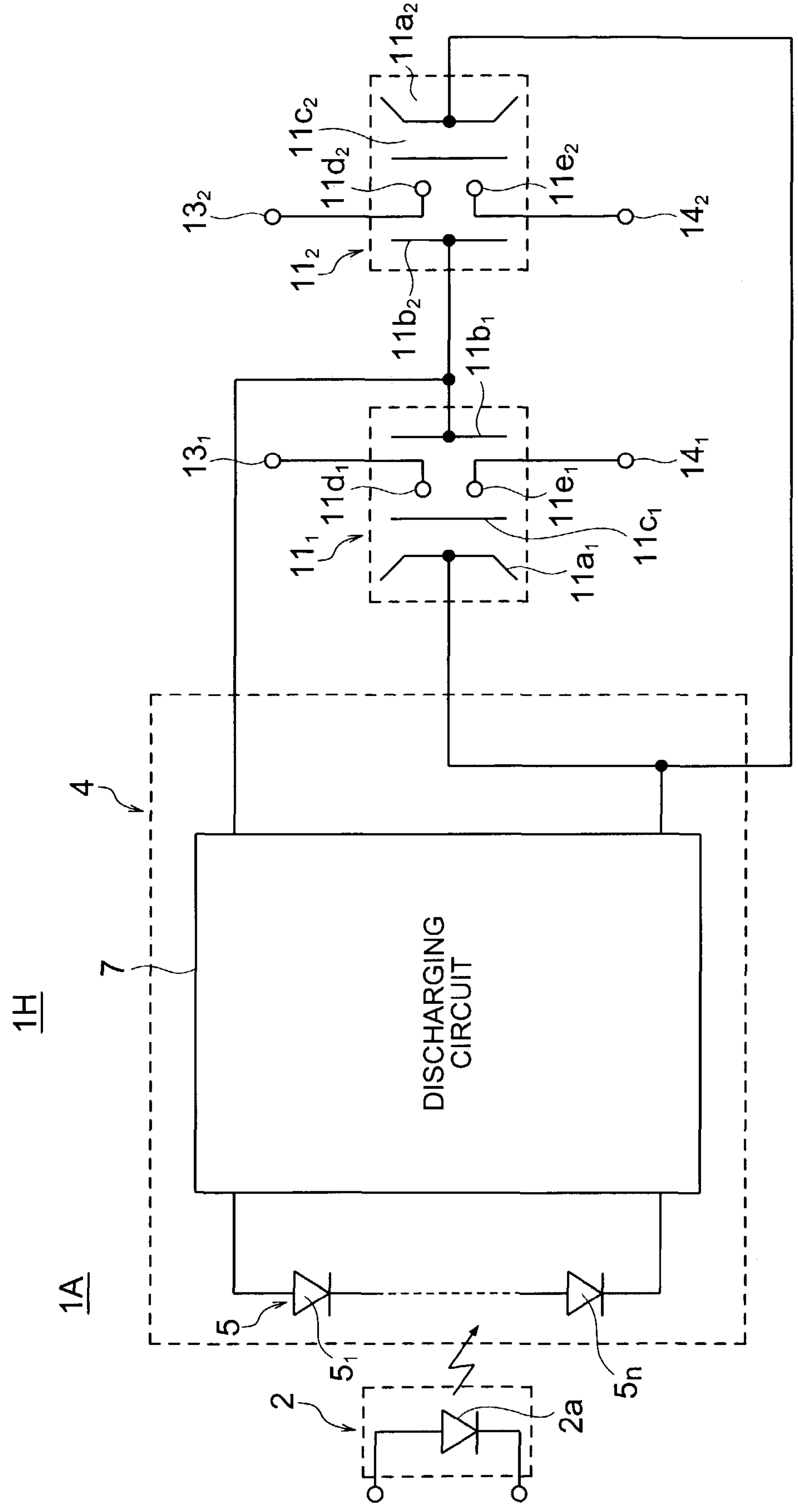
FIG. 18 shows a block diagram of a MEMS apparatus according to a fifteenth embodiment of the present invention.

Shown in FIG. 18 is a MEMS apparatus of a fifteenth embodiment according to the present invention.

A MEMS apparatus 1H in the fifteenth embodiment is equivalent to the counterpart 1A in the second embodiment, except that the former is equipped with two RF-MEMS switches $\mathbf{11}_1$ and $\mathbf{11}_2$, instead of the MEMS 11.

The RF-MEMS switch $\mathbf{11}_1$ is a capacitive type that consists of two electrodes $\mathbf{11}a_1$ and $\mathbf{11}b_1$, and a movable contact $\mathbf{11}c_1$ and fixed contacts $\mathbf{11}d_1$ and $\mathbf{11}e_1$ provided between the electrodes $\mathbf{11}a_1$ and $\mathbf{11}b_1$. The contacts $\mathbf{11}d_1$ and $\mathbf{11}e_1$ are connected to input and output terminals $\mathbf{13}_1$ and $\mathbf{14}_1$, respectively.

The RF-MEMS switch $\mathbf{11}_2$ is also a capacitive type that consists of two electrodes $\mathbf{11}a_2$and $\mathbf{11}b_2$ and a movable contact $\mathbf{11}c_2$ and fixed contacts $\mathbf{11}d_2$ and $\mathbf{11}e_2$ provided between the electrodes $\mathbf{11}a_2$ and $\mathbf{11}b_2$. The contacts $\mathbf{11}d_2$ and $\mathbf{11}e_2$ are connected to input and output terminals $\mathbf{13}_2$ and $\mathbf{14}_2$, respectively.

A low potential is applied to the electrode $\mathbf{11}a_1$ and $\mathbf{11}a_2$ connected to each other. A high potential is applied to the electrode $\mathbf{11}b_1$ and $\mathbf{11}b_2$ connected to each other.

The RF-MEMS switches $\mathbf{11}_1$ and $\mathbf{11}_2$ are turned on or off simultaneously even though different levels of input are supplied thereto.

The fifteenth embodiment has the same advantages as those of the second embodiment.

Two RF-MEMS switches are provided in the fifteenth embodiment. However, three or more of RF-MEMS switches may be provided. All RF-MEMS switches are turned on or off simultaneously no matter how many switches are provided. Each RF-MEMS switch may have an additional RF-MEMS switch connected thereto in series.

[Sixteenth Embodiment]

Figure 19:
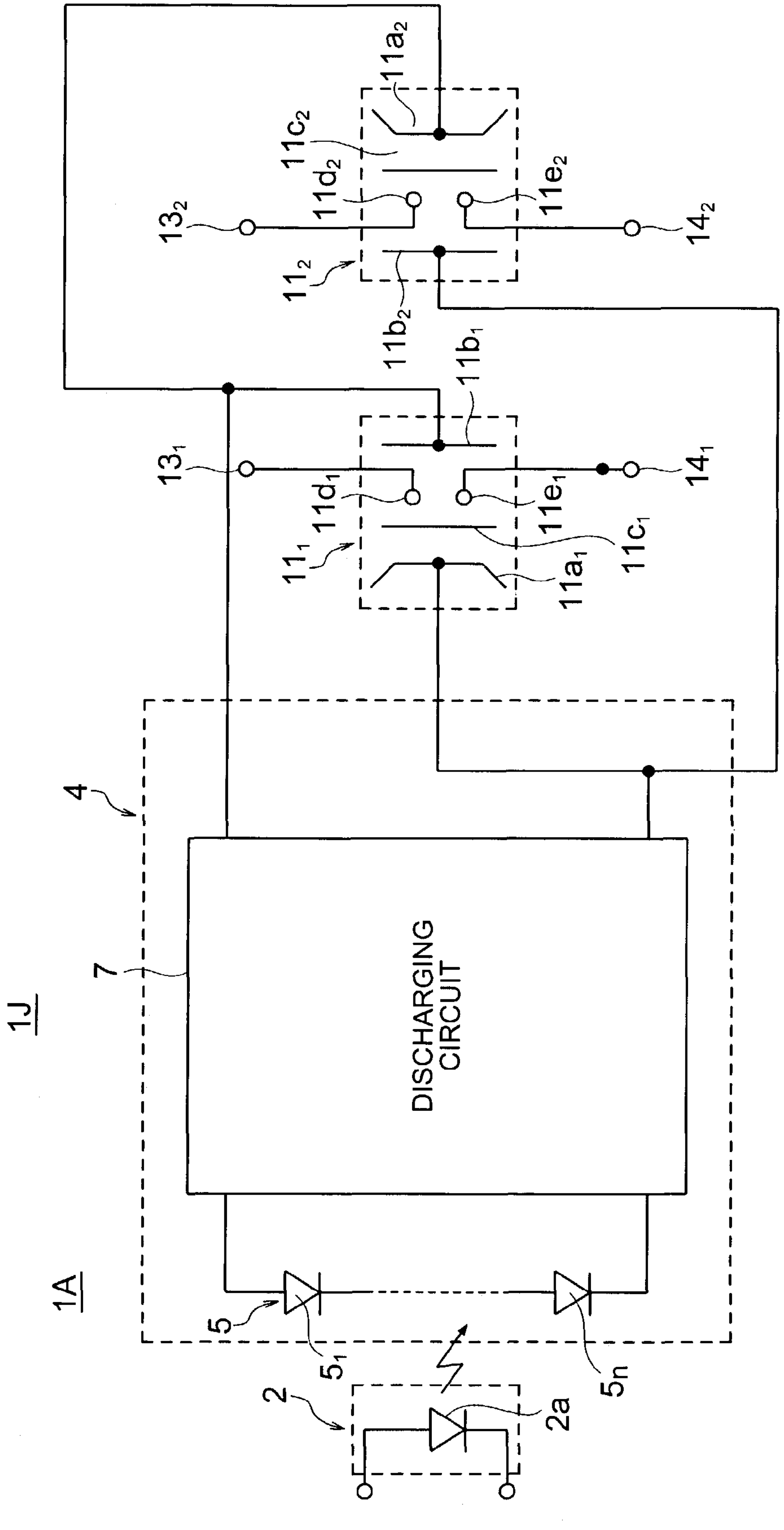
FIG. 19 shows a block diagram of a MEMS apparatus according to a sixteenth embodiment of the present invention.

Shown in FIG. 19 is a MEMS apparatus of a sixteenth embodiment according to the present invention.

A MEMS apparatus 1J in the sixteenth embodiment is equivalent to the counterpart 1A in the second embodiment, except that the former is equipped with two RF-MEMS switches $\mathbf{11}_1$ and $\mathbf{11}_2$ instead of the MEMS 11.

The RF-MEMS switch $\mathbf{11}_1$ is a capacitive type that consists of two electrodes $\mathbf{11}a_1$ and $\mathbf{11}b_1$, and a movable contact $\mathbf{11}c_1$ and fixed contacts $\mathbf{11}d_1$ and $\mathbf{11}e_1$ provided between the electrodes $\mathbf{11}a_1$ and $\mathbf{11}b_1$. The contacts $\mathbf{11}d_1$ and $\mathbf{11}e_1$ are connected to input and output terminals $\mathbf{13}_1$ and $\mathbf{14}_1$, respectively.

The RF-MEMS switch $\mathbf{11}_2$ is also a capacitive type that consists of two electrodes $\mathbf{11}a_2$and $\mathbf{11}b_2$, and a movable contact $\mathbf{11}c_2$ and fixed contacts $\mathbf{11}d_2$ and $\mathbf{11}e_2$ provided between the electrodes $\mathbf{11}a_2$ and $\mathbf{11}b_2$. The contacts $\mathbf{11}d_2$ and $\mathbf{11}e_2$ are connected to input and output terminals $\mathbf{13}_2$ and $\mathbf{14}_2$, respectively.

A low potential is applied to the electrode $\mathbf{11}a_1$ and $\mathbf{11}a_2$ connected to each other. A high potential is applied to the electrode $\mathbf{11}b_1$ and $\mathbf{11}b_2$ connected to each other.

Either of the RF-MEMS switches $\mathbf{11}_1$ and $\mathbf{11}_2$ is turned on while the other turned off in response to different levels of input.

The sixteenth embodiment has the same advantages as those of the second embodiment.

Each RF-MEMS switch may have an additional RF-MEMS switch connected thereto in series.

[Seventeenth Embodiment]

Figure 20:
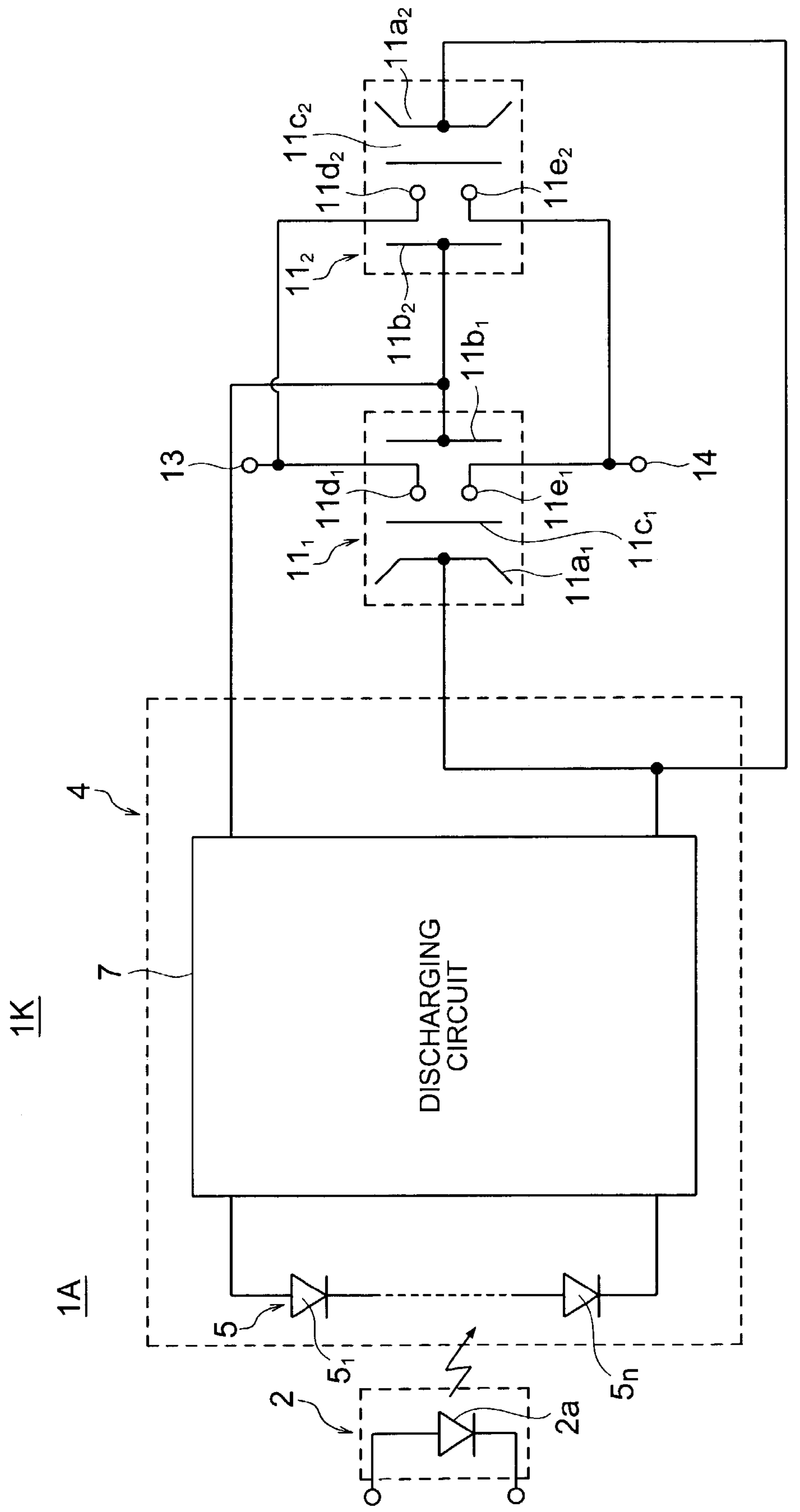
FIG. 20 shows a block diagram of a MEMS apparatus according to a seventeenth embodiment of the present invention.

Shown in FIG. 20 is a MEMS apparatus of a seventeenth embodiment according to the present invention.

A MEMS apparatus 1K in the seventeenth embodiment is equivalent to the counterpart 1H in the fifteenth embodiment, except that the former apparatus's RF-MEMS switches $\mathbf{11}_1$ and $\mathbf{11}_2$ are connected in parallel, sharing an input terminal 13 and an output terminal 14.

The parallel switch configuration accepts shunt currents flowing to the RF-MEMS switches $\mathbf{11}_1$ and $\mathbf{11}_2$ via the input terminal 13, thus having smaller switch capacitance than the counterpart 11 in the second embodiment.

The seventeenth embodiment has the same advantages as those of the second embodiment.

Two RF-MEMS switches are connected in parallel in the seventeenth embodiment. However, three or more of RF-MEMS switches may be connected in parallel.

The RF-MEMS switches $\mathbf{11}_1$ and $\mathbf{11}_2$ are off when no control voltage is applied in this embodiment. However, they may be of a type that is on when no control voltage is applied. Or, they may be of a type having a switching contact.

Each embodiment is provided with an RF-MEMS switch. Such MEMS apparatus driven by a high voltage generated at a photodiode array is applicable to signal control with mechanical deformation in a MEMS mirror, a MEMS optical switch, a MEMS actuator, etc.

As disclosed above in detail, the present invention achieves high reliability in MEMS apparatus with less generation of noises.

It is further understood by those skilled in the art that the foregoing description is a preferred embodiment of the disclosed device and that various change and modification may be made in the invention without departing from the spirit and scope thereof.

What is claimed is:

1. A MEMS (micro electro mechanical system) apparatus comprising:

a light-emitting circuit, having a light-emitting device, to emit light;

a light-receiving circuit having a series circuit of series-connected light-receiving devices that receive the emitted light to generate a voltage;

a MEMS assembly driven by the generated voltage; and a discharging circuit to discharge a voltage generated across the series circuit when emission of light from the light-emitting circuit is brought to a halt.

2. The MEMS apparatus according to claim 1, wherein the MEMS assembly includes an RF-MEMS switch.

3. The MEMS apparatus according to claim 1, wherein the MEMS assembly includes series-connected RF-MEMS switches.

4. The MEMS apparatus according to claim 2, wherein the MEMS assembly includes wiring impedance matched with the RF-MEMS switch.

5. The MEMS apparatus according to claim 1, wherein the discharging circuit includes a junction field-effect transistor, a drain of the transistor being connected to a high-potential terminal of the light-receiving circuit via a first resistor, a gate of the transistor being connected to the high-potential terminal via a second resistor, and a source of the transistor being connected to a low-potential terminal of the light-receiving circuit.

6. The MEMS apparatus according to claim 1, wherein the MEMS assembly includes a MEMS mirror.

7. The MEMS apparatus according to claim 1, wherein the MEMS assembly includes a MEMS optical switch.

8. The MEMS apparatus according to claim 1, wherein the MEMS assembly includes a MEMS actuator.

9. The MEMS apparatus according to claim 1, wherein the discharging circuit includes a semiconductor transistor, a drain of the transistor being connected to a high-potential terminal of the light-receiving circuit via a first resistor, a gate of the transistor being connected to the high-potential terminal via a second resistor, and a source of the transistor being connected to a low-potential terminal of the light-receiving circuit.

* * * * *